(12) United States Patent
Saitoh et al.

(10) Patent No.: US 8,492,219 B2
(45) Date of Patent: Jul. 23, 2013

(54) SEMICONDUCTOR DEVICE MANUFACTURING METHOD

(75) Inventors: Masumi Saitoh, Kanagawa (JP);
Toshinori Numata, Kanagawa (JP);
Yukio Nakabayashi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/487,295

(22) Filed: Jun. 4, 2012

(65) Prior Publication Data
US 2012/0282743 A1 Nov. 8, 2012

Related U.S. Application Data

(63) Continuation of application No. PCT/JP2009/006642, filed on Dec. 4, 2009.

(51) Int. Cl.
*H01L 21/8234* (2006.01)
*H01L 21/337* (2006.01)
*H01L 21/8232* (2006.01)
*H01L 21/336* (2006.01)
*H01L 21/00* (2006.01)

(52) U.S. Cl.
USPC ........... 438/200; 257/347; 257/369; 257/192; 438/283; 438/142; 438/300

(58) Field of Classification Search
USPC .................................... 438/142–308
See application file for complete search history.

(56) References Cited

U.S. PATENT DOCUMENTS
6,372,589 B1 * 4/2002 Yu ................................. 438/304
6,885,055 B2 * 4/2005 Lee ............................... 257/308
(Continued)

FOREIGN PATENT DOCUMENTS
JP 07-211898 A 8/1995
JP 09-116142 A 5/1997
(Continued)

OTHER PUBLICATIONS

FinFET Scaling to 10nm Gate Length Bin Yu, Leland Chang, Shibly Ahmed, Haihong Wang, Scott Bell, Chih-Yuh Yang, Cyrus Tabery, Chau Ho, Qi Xiang, Tsu-Jae King, Jeffrey Bokor, Chenming Hu, Ming-Ren Lin, and David Kyser.*

(Continued)

*Primary Examiner* — Mohsen Ahmadi
*Assistant Examiner* — Evren Seven
(74) *Attorney, Agent, or Firm* — Oblon, Spivak, McClelland, Maier & Neustadt, L.L.P.

(57) ABSTRACT

In a semiconductor device manufacturing method, a first semiconductor region which includes a narrow portion and a wide portion is formed in an upper portion of a semiconductor substrate, a gate insulating film is formed on at least side surfaces of the narrow portion, a gate electrode is formed on the gate insulating film, a mask pattern that covers the wide portion is formed, ion implantation of an impurity is performed with the mask pattern as a mask to form an extension impurity region in the narrow portion, the mask pattern is removed, a heat treatment is performed to activate the impurity, a gate sidewall is formed on a side surface of the gate electrode, epitaxial growth of a semiconductor film is performed on the narrow portion and the wide portion after the formation of the gate sidewall, and source-drain regions is formed on both sides of the gate electrode.

17 Claims, 27 Drawing Sheets

J-J SECTION

U.S. PATENT DOCUMENTS

| | | | | |
|---|---|---|---|---|
| 6,921,963 | B2* | 7/2005 | Krivokapic et al. | 257/618 |
| 7,009,250 | B1* | 3/2006 | Mouli | 257/347 |
| 7,029,958 | B2* | 4/2006 | Tabery et al. | 438/151 |
| 7,105,390 | B2* | 9/2006 | Brask et al. | 438/149 |
| 7,235,468 | B1* | 6/2007 | Mouli | 438/514 |
| 7,282,766 | B2* | 10/2007 | Okuno | 257/347 |
| 7,285,820 | B2* | 10/2007 | Park et al. | 257/316 |
| 7,288,802 | B2* | 10/2007 | Anderson et al. | 257/192 |
| 7,301,210 | B2* | 11/2007 | Abadeer et al. | 257/401 |
| 7,323,389 | B2* | 1/2008 | Goktepeli et al. | 438/281 |
| 7,361,958 | B2* | 4/2008 | Brask et al. | 257/369 |
| 7,384,838 | B2* | 6/2008 | Hsu et al. | 438/230 |
| 7,485,520 | B2* | 2/2009 | Zhu et al. | 438/197 |
| 7,667,271 | B2* | 2/2010 | Yu et al. | 257/347 |
| 7,700,446 | B2* | 4/2010 | Anderson et al. | 438/283 |
| 7,915,682 | B2* | 3/2011 | Hsu et al. | 257/347 |
| 7,915,693 | B2* | 3/2011 | Okano | 257/401 |
| 8,030,144 | B2* | 10/2011 | Luning et al. | 438/157 |
| 8,080,838 | B2* | 12/2011 | Chang et al. | 257/288 |
| 8,124,465 | B2* | 2/2012 | Yagishita | 438/157 |
| 8,222,154 | B2* | 7/2012 | Doris et al. | 438/705 |
| 2006/0094196 | A1 | 5/2006 | Kim | |
| 2007/0045748 | A1* | 3/2007 | Booth et al. | 257/369 |
| 2007/0075372 | A1* | 4/2007 | Terashima et al. | 257/360 |
| 2007/0235819 | A1* | 10/2007 | Yagishita | 257/401 |
| 2007/0257296 | A1 | 11/2007 | Miyano | |
| 2007/0290265 | A1* | 12/2007 | Augusto et al. | 257/351 |
| 2008/0001171 | A1 | 1/2008 | Tezuka et al. | |
| 2008/0277729 | A1 | 11/2008 | Gossner et al. | |
| 2009/0026505 | A1 | 1/2009 | Okano | |

FOREIGN PATENT DOCUMENTS

| | | |
|---|---|---|
| JP | 2000-164857 A | 6/2000 |
| JP | 2000-311861 A | 11/2000 |
| JP | 2002-008999 A | 1/2002 |
| JP | 2006-128427 A | 5/2006 |
| JP | 2007-53387 A | 3/2007 |
| JP | 2007-299991 A | 11/2007 |
| JP | 2008-10790 A | 1/2008 |
| JP | 2009-32955 A | 2/2009 |

OTHER PUBLICATIONS

International Search Report issued Jan. 12, 2010 in PCT/JP2009/006642 filed Dec. 4, 2009.

M. Guillorn et al., Digest of VLSI Symposium on Technology, "FinFET performance Advantage at 22nm: An AC Perspective," 2008, pp. 12-13.

* cited by examiner

A-A SECTION

B-B SECTION

C-C SECTION

D-D SECTION

E-E SECTION

F-F SECTION

G-G SECTION

H-H SECTION

NANOWIRE

|  | WITHOUT ION IMPLANTATION | BORON ION IMPLANTATION 6e14cm$^{-2}$, 1KeV, 0 DEGREE |
|---|---|---|
| DESIGN WIDTH 100nm (WIDE PORTION) |  | GROWTH OBSTRUCTION IN CENTRAL PORTION |
| DESIGN WIDTH 15nm (NARROW PORTION) |  |  |

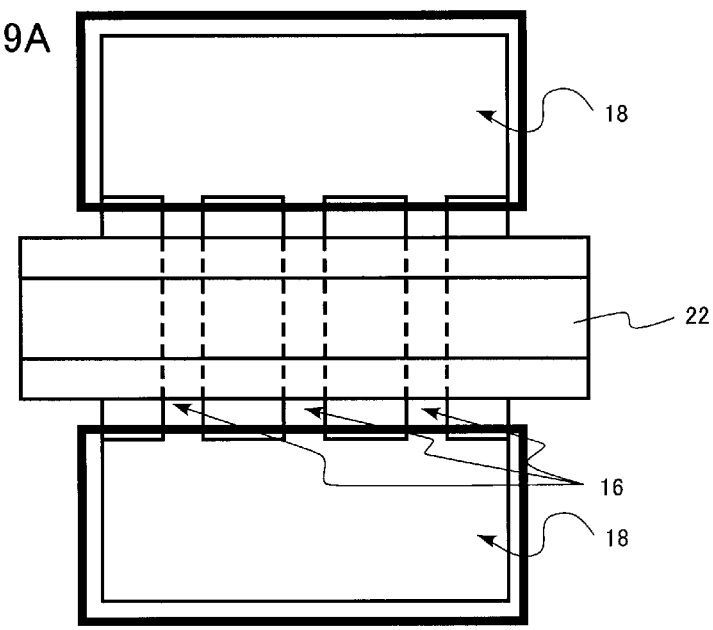
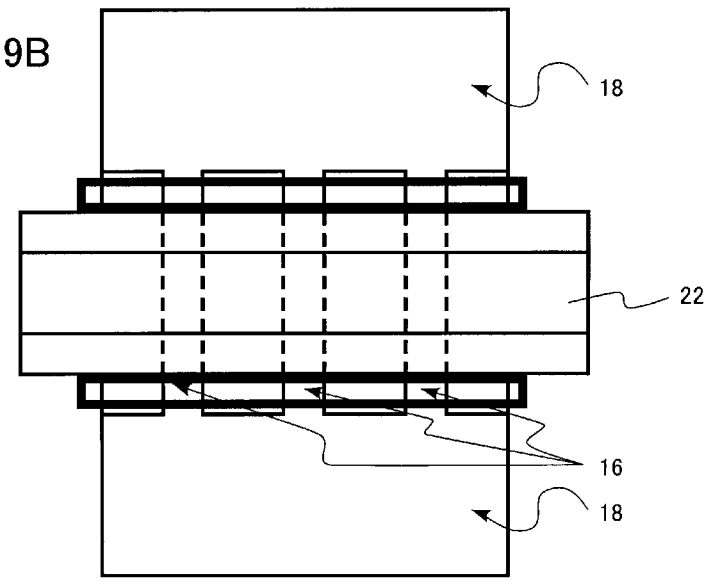

FIG.20A
NANOWRE HEIGHT 10nm
|  | PHOSPHOROUS ION IMPLANTATION 5e14cm$^{-2}$, 3KeV, 0 DEGREE | ARSENIC ION IMPLANTATION 4e14cm$^{-2}$, 4KeV, 0 DEGREE |
|---|---|---|
| DESIGN WIDTH 100nm (WIDE PORTION) | 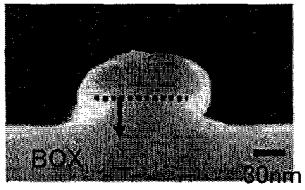 | 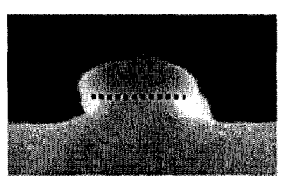 |
| DESIGN WIDTH 15nm (NARROW PORTION) | 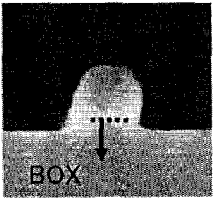 | 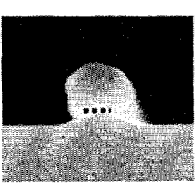 |
FIG.20B
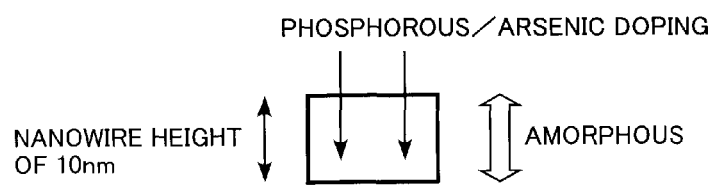

NANOWIRE HEIGHT OF 25nm

|  | PHOSPHOROUS ION IMPLANTATION $5e14cm^{-2}$, 3KeV, 0 DEGREE | ARSENIC ION IMPLANTATION $4e14cm^{-2}$, 4KeV, 0 DEGREE |
|---|---|---|
| DESIGN WIDTH 100nm (WIDE PORTION) | | |
| DESIGN WIDTH 15nm (NARROW PORTION) | | |

I-I SECTION

J-J SECTION

K-K SECTION

| BORON ION IMPLANTATION | PRE-EPITAXIAL-GROWTH HEIGHT |
| $5e14cm^{-2}$, 1KeV, 30 DEGREE | OF 15nm |

| NANOWIRE SIDE SURFACE ORIENTATION | (110) PLANE | (111) PLANE |
|---|---|---|
| DESIGN WIDTH OF 20nm | | |

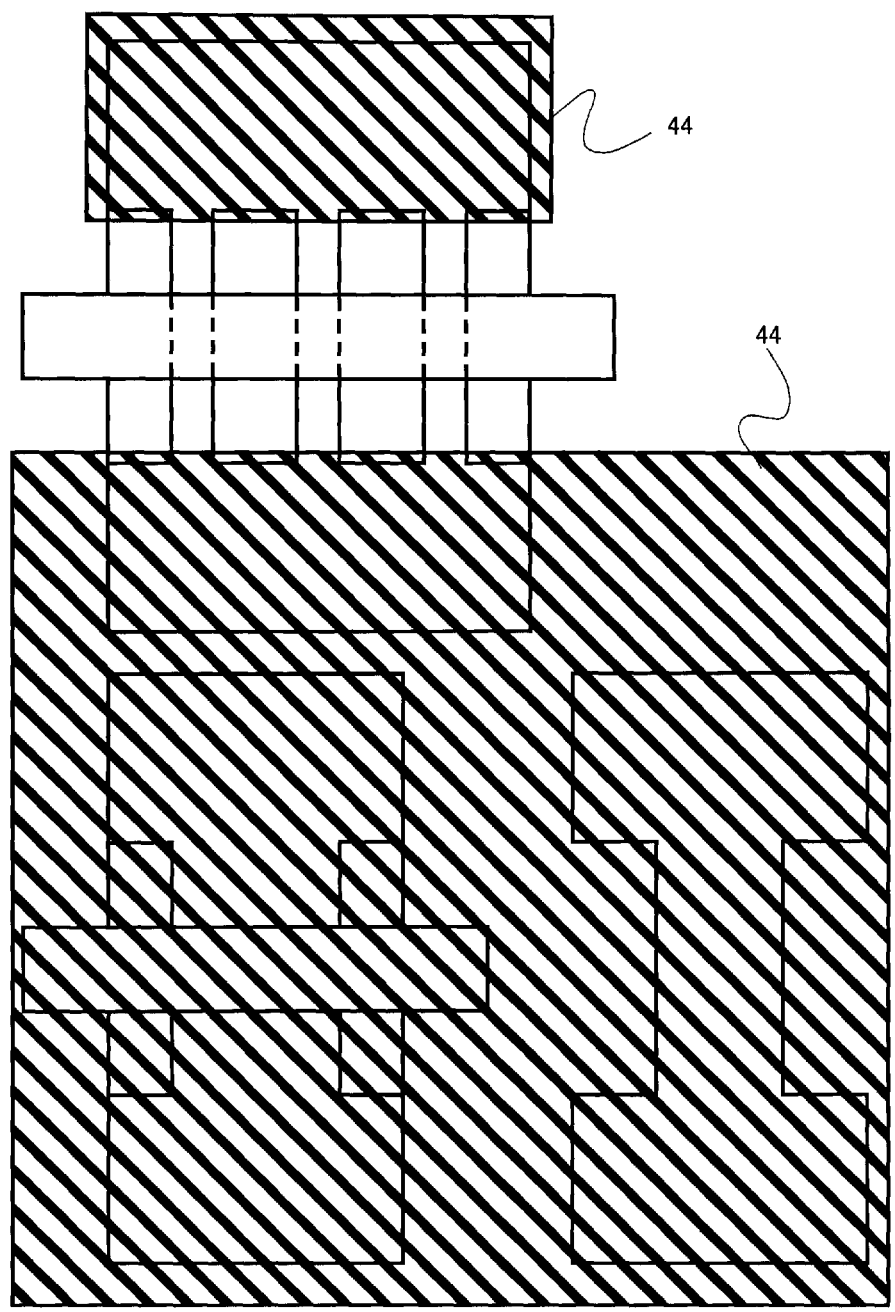

US 8,492,219 B2

SEMICONDUCTOR DEVICE MANUFACTURING METHOD

CROSS-REFERENCE TO RELATED APPLICATION

This application is continuation application based upon the International Application PCT/JP2009/006642, the International Filing Date of which is Dec. 4, 2009, the entire content of which is incorporated herein by reference.

FIELD

Embodiments described herein relate generally to a semiconductor device manufacturing method.

BACKGROUND

In order to make an ultrafine MISFET having a gate length of 30 nm or less, a transistor having a three-dimensional structure, for example, a nanowire type transistor (hereinafter also referred to as a nanowire transistor) is expected instead of a planar transistor of the background art. For example, for a nanowire transistor in which an SOI layer is used as a channel, a gate insulating film and a gate electrode are formed in a side surface and an upper surface of a silicon narrow portion (silicon nanowire) connected to a silicon wide portion. An extension region is formed in the narrow portion while a channel region below the gate electrode is interposed there between. A source-drain region is formed in the silicon wide portion.

A nanowire transistor has a strong gate controlling power and a high short-channel-effect immunity because the channel region is covered with the gate. Because all the three surfaces of the silicon nanowire, namely, the upper surface and both the side surfaces operate as the channel, the silicon nanowire is also called a tri-gate transistor.

In the nanowire transistor, a leakage current can be suppressed in an off-state because of the high short-channel-effect immunity. However, unfortunately a drain current may be reduced in an on-state because of a high parasitic resistance in the narrow portion. A silicon nanowire region where the gate electrode is not formed is effectively shortened in order to reduce the parasitic resistance. However, during lithographically forming a silicon nanowire pattern, when the wide portion is brought close to the gate electrode direction in order to shorten the silicon nanowire, it is difficult to make a width of the silicon nanowire small due to a proximity effect.

A Fin type channel transistor (hereinafter also referred to as a FinFET) is also widely studied as the transistor having the three-dimensional structure. In the FinFET, only the side surfaces of a Fin layer corresponding to the silicon nanowire of the nanowire transistor operate as the channel. The upper surface of the Fin layer is covered with a thick hard mask. Therefore, the upper surface does not operate as the channel. Unfortunately the parasitic resistance may be increased because the width of the Fin layer is narrow like the nanowire transistor.

A technology of selectively performing silicon epitaxial growth on the Fin layer in the region where the gate electrode is not formed has been disclosed. According to the technology, the parasitic resistance can be reduced because of an increased sectional area in the Fin layer.

BRIEF DESCRIPTION OF THE DRAWINGS

FIGS. 19A and 19B are views illustrating action and effect of the first embodiment;

FIGS. 20A and 20B are sectional photographs for the silicon pattern having the height of 10 nm of a second embodiment;

FIG. 32 is a schematic plan view illustrating the manufacturing process of the fifth embodiment.

DETAILED DESCRIPTION

Figure 1:
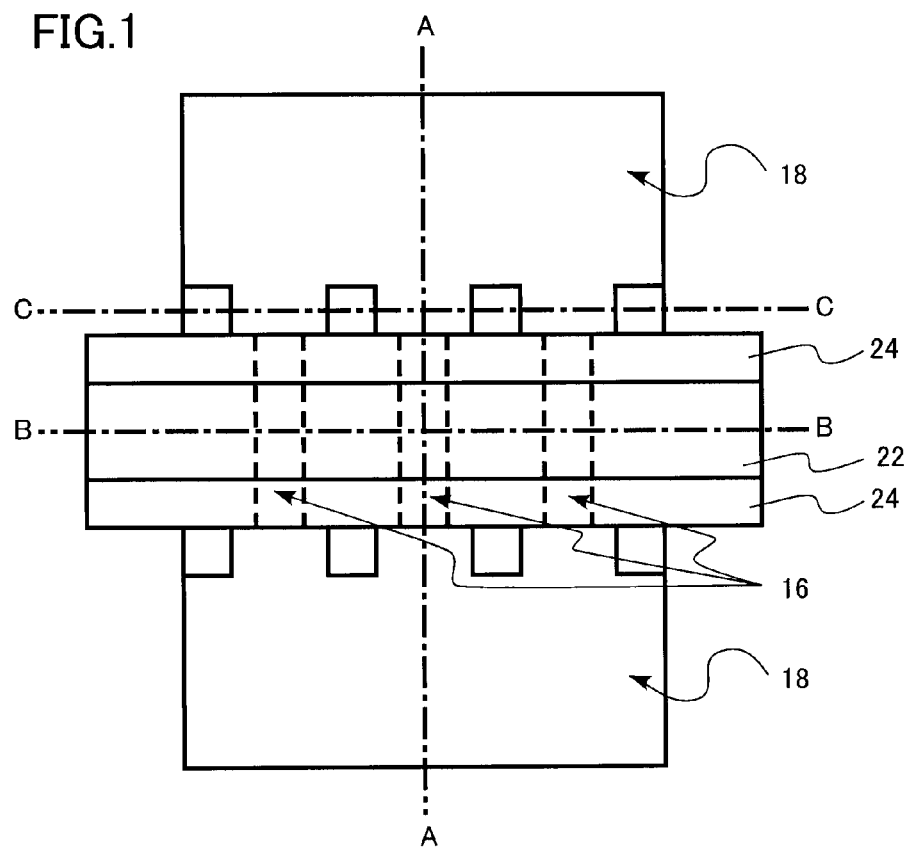
FIG. 1 is a schematic plan view of a nanowire transistor manufactured by a manufacturing method of a first embodiment.

A semiconductor device manufacturing method of an embodiment includes: forming a first semiconductor region, which includes a narrow portion and a wide portion, in an upper portion of a semiconductor substrate; forming a gate insulating film on at least side surfaces of the narrow portion; forming a gate electrode on the gate insulating film; forming a mask pattern that covers the wide portion; performing ion implantation of an impurity with the mask pattern as a mask to form an extension impurity region in the narrow portion; removing the mask pattern; performing a heat treatment to activate the impurity; forming a gate sidewall on a side surface of the gate electrode; performing epitaxial growth of a semiconductor film on the narrow portion and the wide portion after the formation of the gate sidewall; and forming source-drain regions on both sides of the gate electrode.

Hereinafter, embodiments will be described with reference to the drawings. In the following description, notations of a (100) plane and a (110) plane are used as representative notations of a {100} plane and a {110} plane. Notations of a <100> direction and a <110> direction are used as representative notations of directions crystallographically equivalent to a [100] direction and a [100] direction.

In the following description, expression that semiconductor surface is a (100) plane orientation is not limited to the case that the semiconductor surface is completely matched with the (100) plane, but the expression includes the case that the semiconductor surface has an inclination angle of about ±2 degrees relative to the (100) plane. The same holds true for the expressions of the <100> direction and the <110> direction. The reason the angle range of about ±2 degrees is included is that, for the viewpoint of accuracy, the directions or the orientations are hardly completely matched with each other in manufacturing the semiconductor device, and action and effect of the invention can sufficiently be obtained within the angle error range of about ±2 degrees.

First Embodiment

In a semiconductor device manufacturing method of a first embodiment, a first semiconductor region which includes a narrow portion and a wide portion is formed in an upper portion of a semiconductor substrate, a gate insulating film is formed on at least side surfaces of the narrow portion, a gate electrode is formed on the gate insulating film, a mask pattern that covers the wide portion is formed, ion implantation of an impurity is performed with the mask pattern as a mask to form an extension impurity region in the narrow portion, the mask pattern is removed, a heat treatment is performed to activate the impurity, a gate sidewall is formed on a side surface of the gate electrode, epitaxial growth of a semiconductor film is performed on the semiconductor substrate after the formation of the gate sidewall, and source-drain regions are formed on both sides of the gate electrode. In the first embodiment, production of a semiconductor device including a p-type nanowire transistor is described as an example.

The semiconductor device manufacturing method of the first embodiment has the above configuration, which suppresses growth obstruction of an epitaxial film in the wide portion of the semiconductor region during the epitaxial growth. Accordingly, the semiconductor device including the nanowire transistor in which an on-current is improved can effectively be manufactured.

Figure 2:
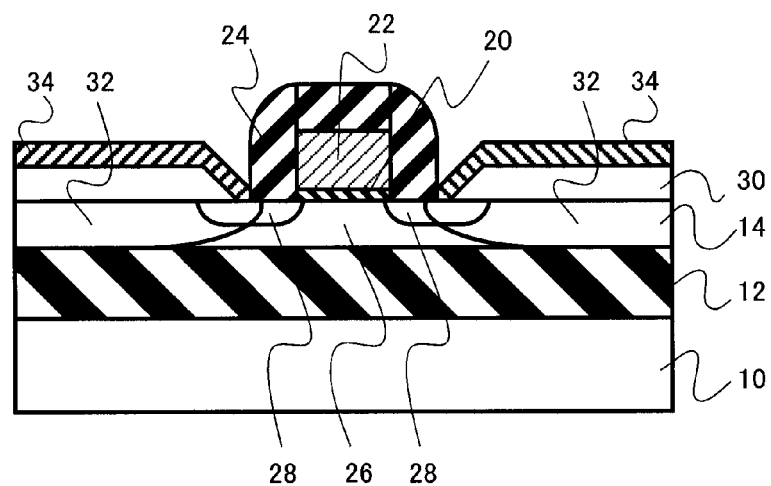
FIG. 2 is a schematic sectional view taken on a line A-A (gate-length direction) of FIG. 1.
Figure 3:
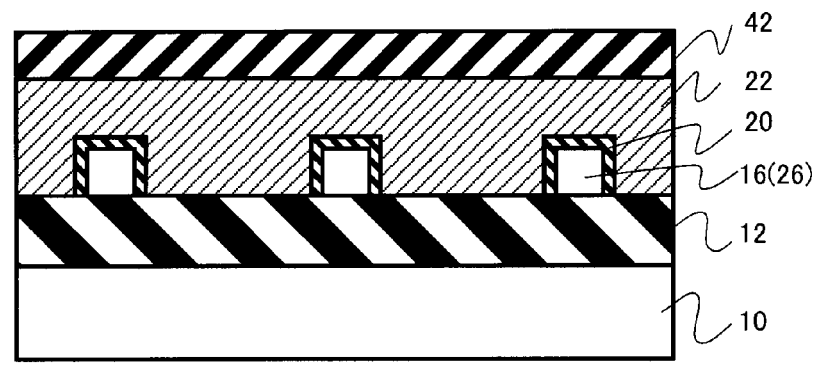
FIG. 3 is a schematic sectional view taken on a line B-B (gate-width direction) of FIG. 1.
Figure 4:
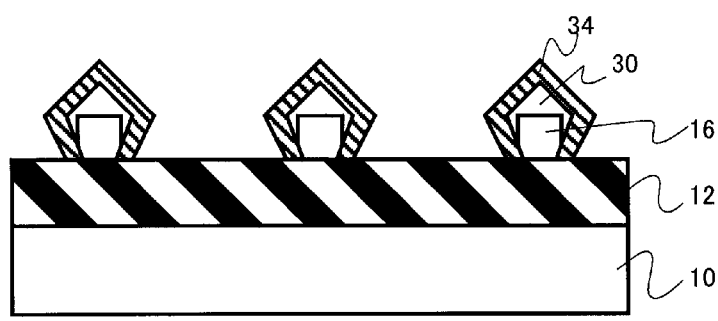
FIG. 4 is a schematic sectional view taken on a line C-C (gate-width direction) of FIG. 1.

FIG. 1 is a schematic plan view of the nanowire transistor manufactured by the manufacturing method of the first embodiment. FIG. 2 is a schematic sectional view taken on a line A-A (gate-length direction) of FIG. 1, FIG. 3 is a schematic sectional view taken on a line B-B (gate-width direction) of FIG. 1, and FIG. 4 is a schematic sectional view taken on a line C-C (gate-width direction) of FIG. 1.

For example, the nanowire transistor is formed in an SOI layer 14 on a buried oxide film (BOX) 12 provided on a (100)-plane silicon substrate 10. The SOI layer 14 includes one or more narrow portions (silicon nanowire) 16 and a wide portion 18, which is physically connected to the narrow portion 16 and is wider than the narrow portion 16.

A gate insulating film 20 is formed on a side surface and an upper surface of the silicon nanowire 16, and a gate electrode 22 is formed on the gate insulating film 20. Gate sidewalls 24 are formed on both sides of the gate electrode 22.

P-type extension impurity regions 28 are formed in the gate sidewalls 24 and the silicon nanowire 16 such that a channel region 26 below the gate electrode 22 is sandwiched between the extension impurity regions 28. An epitaxial silicon layer 30 is formed on the extension impurity region 28.

P-type source-drain impurity regions 32 are formed in the silicon nanowire 16 and the epitaxial silicon layer 30. Metal silicide layers 34 are formed on the source-drain impurity regions 32. Thus, the source-drain regions, each of which includes the source-drain impurity region 32 and the metal silicide layer 34, are formed on both the sides of the gate electrode 22.

In the silicon nanowire 16, the region above which the gate electrode 22 is formed operates as the channel region 26. The channel region 26 is formed into a plate-like structure having widths (length in a gate-width direction) of about 3 nm to about 20 nm and heights of about 3 nm to about 40 nm. The side surface of the silicon nanowire 16 is the (110) plane.

In the structure, the epitaxial silicon layer 30 having thicknesses of 10 nm to 50 nm is formed on the region above which the gate electrode 22 and the gate sidewall 24 are not formed in the silicon nanowire 16. Therefore, a silicon sectional area is increased to largely reduce a parasitic resistance. Accordingly, an on-current of the transistor is significantly improved.

The manufacturing method of the first embodiment will be described below with reference to FIGS. 5 to 15.

First an SOI substrate is prepared as a semiconductor substrate. For example, the SOI substrate includes the buried oxide film 12 made of a silicon oxide film and the SOI layer 14 formed on the buried oxide film 12. The SOI layer has thicknesses of about 3 nm to about 40 nm. For example, a hard mask layer 40 made of a silicon nitride film is formed on the SOI layer 14.

Figure 5:
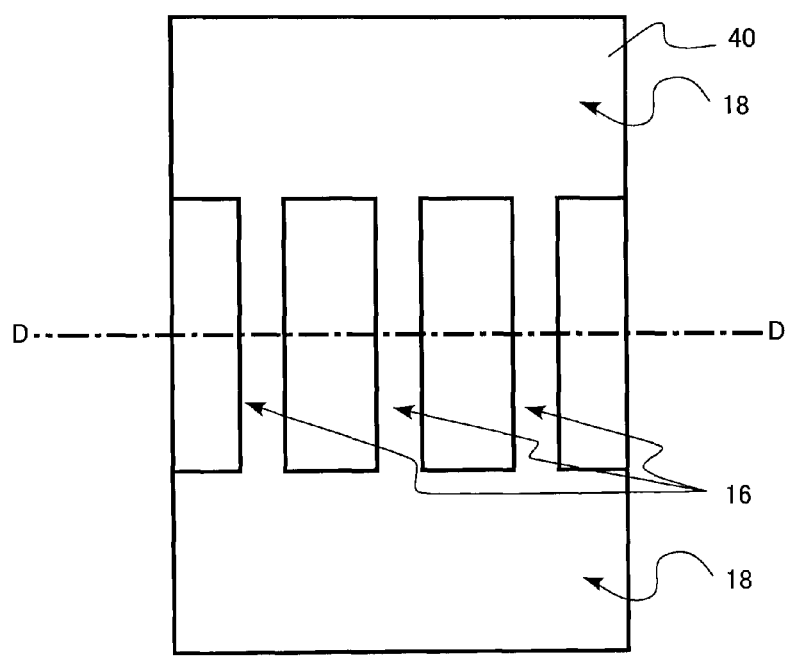
FIG. 5 is a schematic plan view illustrating a manufacturing process of the first embodiment.
Figure 6:
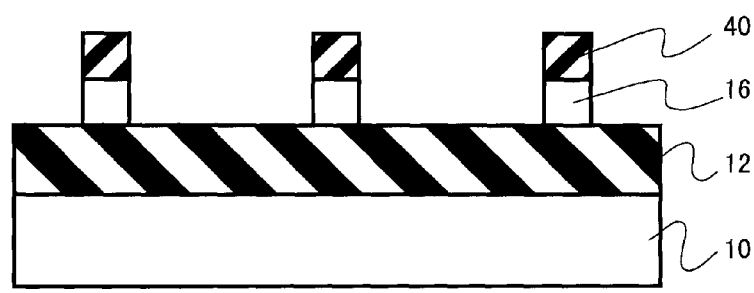
FIG. 6 is a schematic sectional view taken on a line D-D of FIG. 5.

FIG. 5 is a schematic plan view illustrating a manufacturing process of the first embodiment, and FIG. 6 is a schematic sectional view taken on a line D-D of FIG. 5. The hard mask layer 40 is patterned after formed on the SOI layer 14.

The SOI layer 14 is etched with the hard mask layer 40 as a mask, and the SOI layer 14 is partially narrowed in a gate-width direction, thereby forming a plate shape (see FIGS. 5 and 6). The plate-like silicon layer (silicon nanowire) 16 has widths of about 3 nm to about 20 nm. Thus, the semiconductor region including the narrow portion 16 and the wide portion 18 is formed in the upper portion of the semiconductor substrate.

In patterning the hard mask layer 40, both the gate-length direction and the narrow-portion direction are set to a direction equivalent to the <110> direction, whereby the side surface of the silicon nanowire 16 constitutes the (110) plane after the etching.

Figure 7:
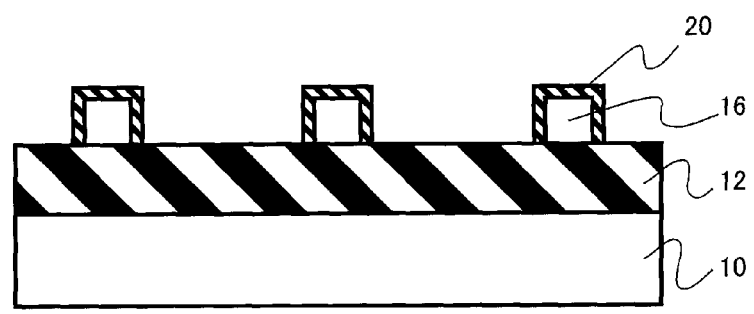
FIG. 7 is a schematic sectional view in the gate-width direction illustrating the manufacturing process of the first embodiment.

FIG. 7 is a schematic sectional view in the gate-width direction illustrating the manufacturing process of the first embodiment. As illustrated in FIG. 7, the hard mask layer 40 is removed after the SOI layer 14 is patterned using the hard mask layer 40. Then the gate insulating film 20 is formed on the side surface and the upper surface of the silicon nanowire 16. A silicon oxide film, a silicon oxynitride film, a high-dielectric-constant film, and a stacked film of the silicon oxide film and the high-dielectric-constant film can be used as the gate insulating film 20.

Then the gate electrode 22 is formed on the gate insulating film 20, and a gate electrode patterning hard mask layer 42 is formed on the gate electrode 22. The hard mask layer 42 is patterned. At this point, poly-Si, metal silicide, TiN, W, TaC, and a stacked film of poly-Si and metal can be used as the gate electrode 22.

Figure 8:
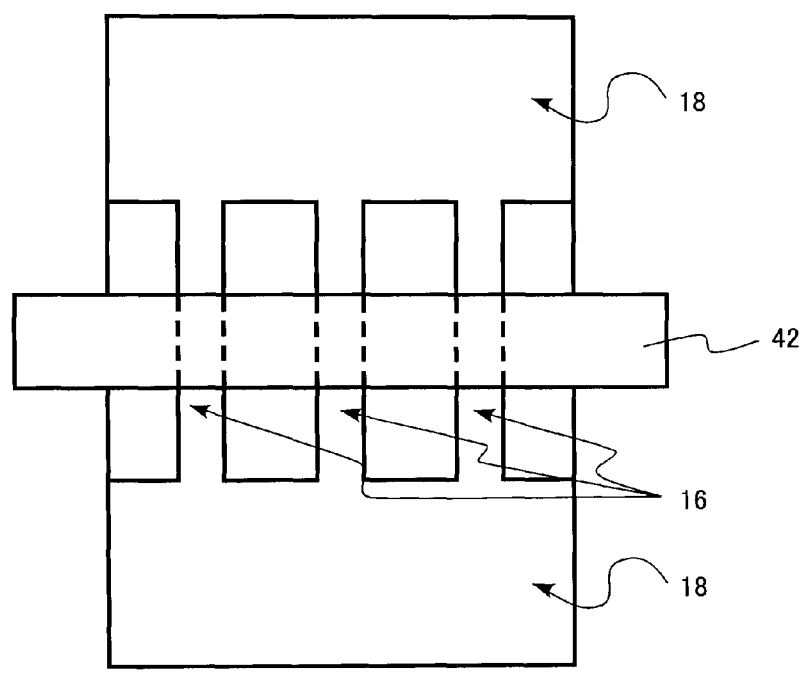
FIG. 8 is a schematic plan view illustrating the manufacturing process of the first embodiment.

FIG. 8 is a schematic plan view illustrating the manufacturing process of the first embodiment. After the formation of the gate electrode patterning hard mask layer 42, the gate electrode 22 and the gate insulating film 20 are patterned with the hard mask layer 42 as the mask. As illustrated in FIG. 8, the gate electrode (not illustrated) and the gate insulating film (not illustrated) are left only on part of the narrow portion 16 in the semiconductor region.

Figure 9:
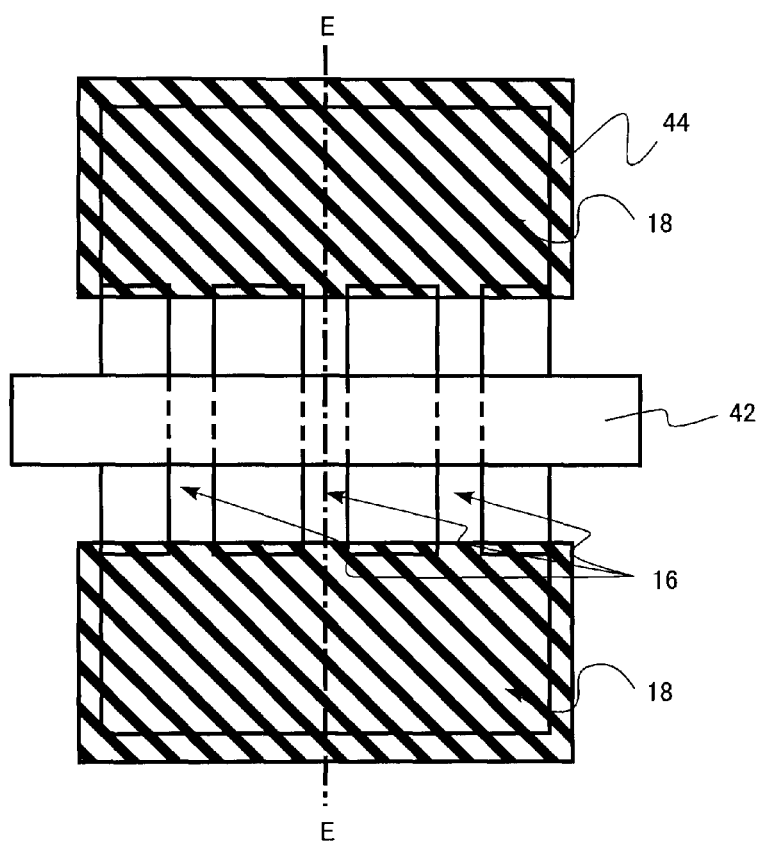
FIG. 9 is a schematic plan view illustrating the manufacturing process of the first embodiment.
Figure 10:
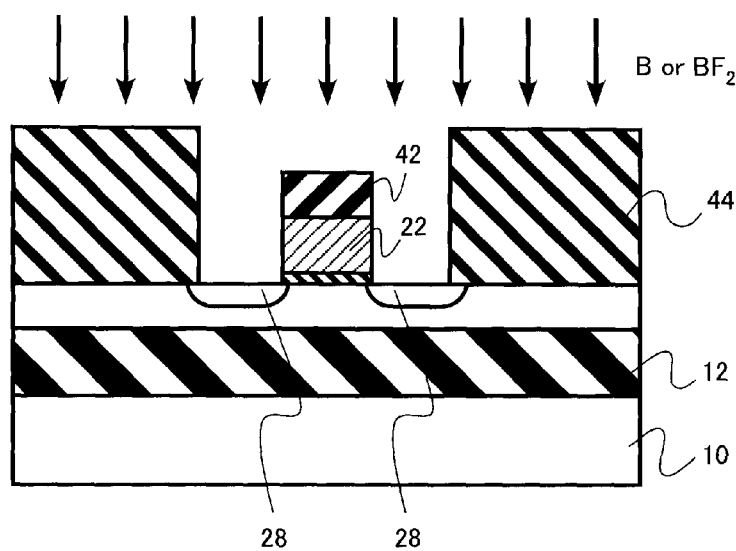
FIG. 10 is a schematic sectional view taken on a line E-E of FIG. 9.

FIG. 9 is a schematic plan view illustrating the manufacturing process of the first embodiment. FIG. 10 is a schematic sectional view taken on a line E-E of FIG. 9. As illustrated in FIG. 9, after the gate electrode 22 and the gate insulating film 20 are patterned, a mask pattern that covers at least the wide portion 18 in the semiconductor region is formed using a photo resist 44.

As illustrated in FIG. 10, for example, extension ion implantation of boron (B) or boron difluoride ($BF_2$) is performed with the photo resist 44 as the mask. Through the extension ion implantation, the extension impurity region 28 is formed in the narrow portion (silicon nanowire) 16, which is exposed because the gate electrode 22 is not formed thereon. Desirably, from the viewpoint of reducing the parasitic resistance, the extension impurity region 28 has an impurity concentration of $1 \times 10^{19}$ $cm^{-3}$ or more.

The extension ion implantation is not performed to the wide portion 18, so that deposition obstruction can be suppressed in the wide portion 18 in the subsequent epitaxial film growth.

The photo resist 44 is removed after the extension ion implantation. Then, for example, annealing is performed in a nitrogen atmosphere. Through the annealing, silicon that becomes in an amorphous state by the ion implantation is recrystallized while the implanted impurity is activated.

Desirably an annealing temperature is equal to or more than 800° C. from necessity of the sufficient activation and recrystallization, and desirably the annealing temperature is equal to or lower than 1100° C. from the viewpoint of preventing excessive impurity diffusion.

Figure 11:
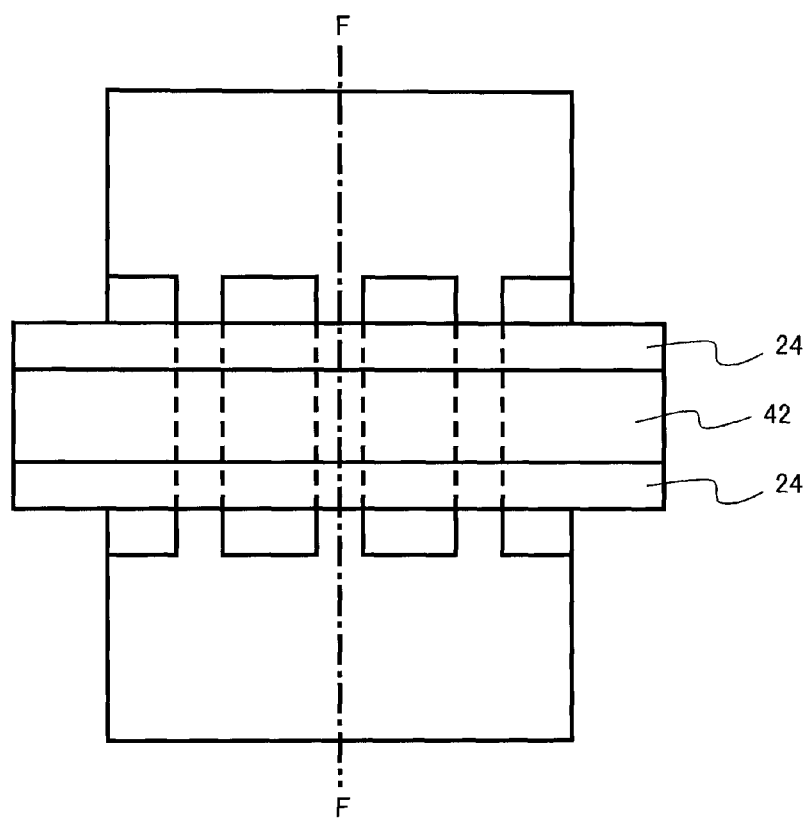
FIG. 11 is a schematic plan view illustrating the manufacturing process of the first embodiment.
Figure 12:
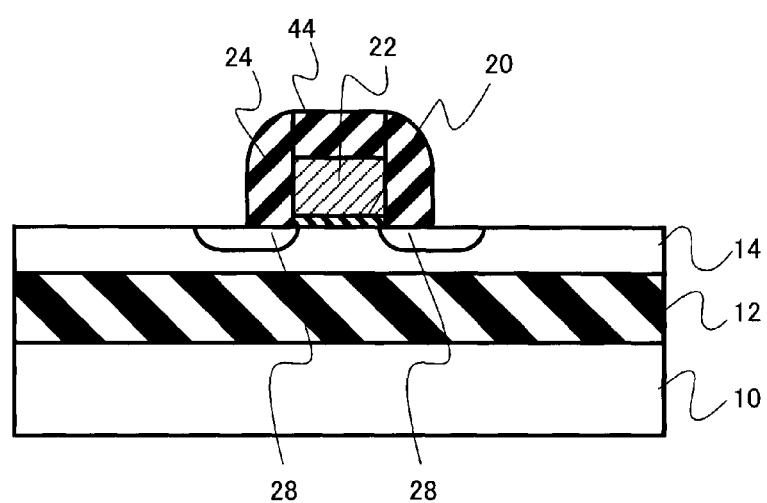
FIG. 12 is a schematic sectional view taken on a line F-F of FIG. 11.

FIG. 11 is a schematic plan view illustrating the manufacturing process of the first embodiment. FIG. 12 is a schematic sectional view taken on a line F-F of FIG. 11. After the annealing, as illustrated in FIGS. 11 and 12, a gate sidewall material is deposited on the whole surface, and the gate sidewalls 24 are formed on both the side surfaces of the gate electrode 22 by performing dry etching of RIE (Reactive Ion Etching).

For example, an oxide film, a nitride film, and a stacked film of the oxide film and the nitride film can be used as a material for the gate sidewall 24. Desirably the thickness in the gate-length direction of the gate sidewall 24 is equal to or more than 5 nm from the viewpoint of reducing the parasitic capacitance, and desirably the thickness is equal to or less than 30 nm from the viewpoint of shortened a distance to the epitaxial layer to reduce the parasitic resistance.

Figure 13:
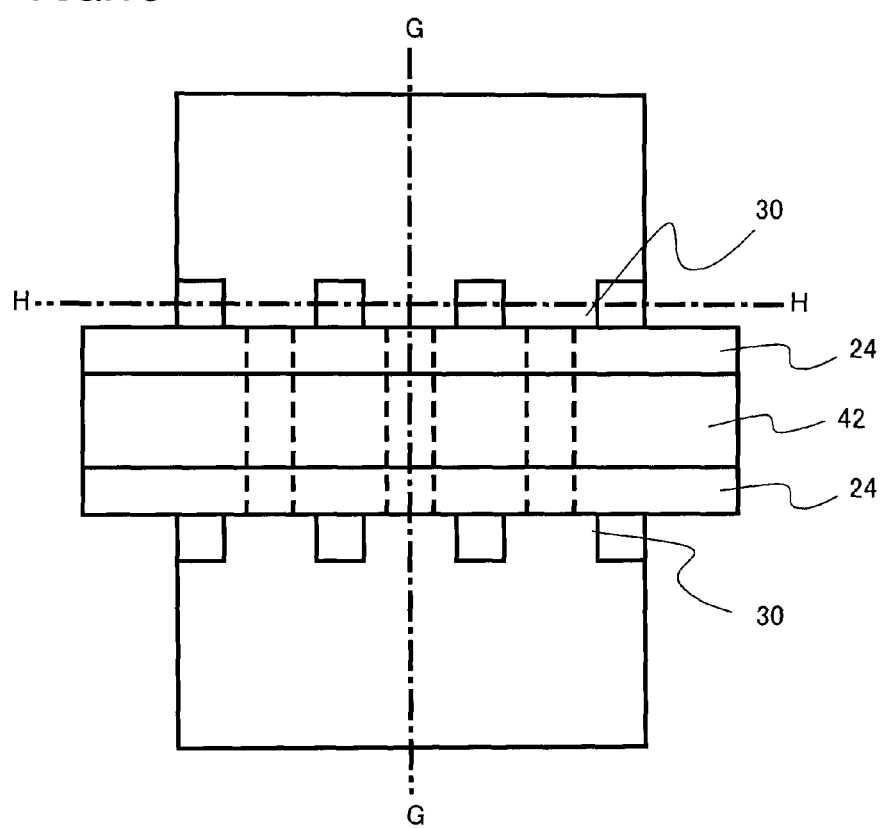
FIG. 13 is a schematic plan view illustrating the manufacturing process of the first embodiment.
Figure 14:
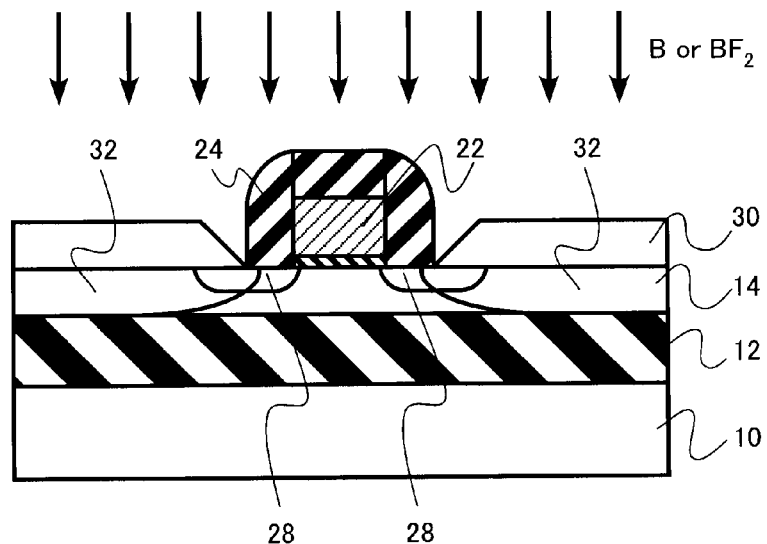
FIG. 14 is a schematic sectional view taken on a line G-G of FIG. 13.
Figure 15:
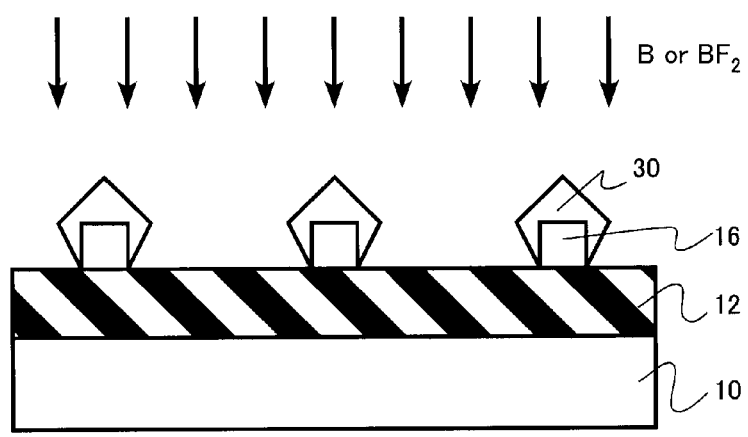
FIG. 15 is a schematic sectional view taken on a line H-H of FIG. 13.

FIG. 13 is a schematic plan view illustrating the manufacturing process of the first embodiment. FIG. 14 is a schematic sectional view taken on a line G-G of FIG. 13, and FIG. 15 is a schematic sectional view taken on a line H-H of FIG. 13.

After the formation of the gate sidewall 24, epitaxial growth of a silicon film is performed on an exposed portion of the SOI layer 14 to form the epitaxial silicon layer 30. Then source-drain ion implantation of B or $BF_2$ is performed to the whole surface of the exposed portion of the SOI layer 14, namely, not only the narrow portion 16 but also the wide portion 18 to form the source-drain impurity region 32.

As to an example of a process of selectively forming the epitaxial film on the exposed portion of the SOI layer 14, the epitaxial silicon film is grown with hydrochloric acid as an etching gas and with dichlorosilane as a deposition gas in a hydrogen carrier gas atmosphere after a dilute hydrofluoric acid treatment and hydrogen baking treatment are performed to remove a natural oxide film on the surface of the SOI layer 14.

Desirably the thickness of the epitaxial film is equal to or more than 10 nm from the viewpoint of reducing the parasitic resistance, and desirably the thickness is equal to or less than 50 nm from the viewpoint of reducing the parasitic capacitance between the gate electrode 22 and the epitaxial silicon layer 30 and shortening a process time. Desirably, from the viewpoint of reducing the parasitic resistance, the source-drain impurity region 32 has an impurity concentration of $1 \times 10^{20}$ $cm^{-3}$ or more.

After the formation of the source-drain impurity region 32, for example, a nickel film is deposited as a metallic film on the semiconductor region by sputtering. Then, a heat treatment is performed in a non-oxidation atmosphere, such as a nitrogen atmosphere and an argon atmosphere, to cause the metallic film and the epitaxial silicon layer 30 to react with each other, thereby forming the metal silicide layer 34. Then the unreacted metallic film is removed by a well-known chemical solution treatment.

The semiconductor device illustrated in FIGS. 1 to 4 is manufactured through the above manufacturing process. Then action and effect of the first embodiment will be described in detail.

In the manufacturing method of the first embodiment, after the extension impurity region is formed, the epitaxial film is formed on the impurity region. Usually a crystalline state and a surface state of silicon are changed when the ion implantation is performed to silicon. Because the epitaxial film forming process is sensitive to the state of the substrate silicon, possibly the silicon state changed by the ion implantation adversely influences the epitaxial film forming process.

The influence of the ion implantation on the epitaxial film formation was experimentally checked by forming the epitaxial film after the ion implantation of the impurity into the SOI layer. Using the SOI substrate, the boron ion implantation is performed after silicon patterns having heights of 25 nm and 10 nm are formed on the buried oxide film. As to boron ion implantation conditions, an implantation angle is 0 degree, an acceleration voltage is 1 keV, and a dose amount is $6 \times 10^{14}$ $cm^{-2}$. The wide portion having a design width of 100 nm and the narrow portion having a design width of 15 nm are provided in the silicon pattern.

After the ion implantation, nitrogen annealing is performed at 800° C. for 5 seconds in order to activate the ion, and a TEOS film corresponding to the gate sidewall of the actual nanowire transistor is deposited with a thickness of 50 nm. Then the TEOS film is removed by the RIE. The epitaxial silicon film is formed after the dilute hydrofluoric acid treatment is performed.

Figures 16A, 16B:
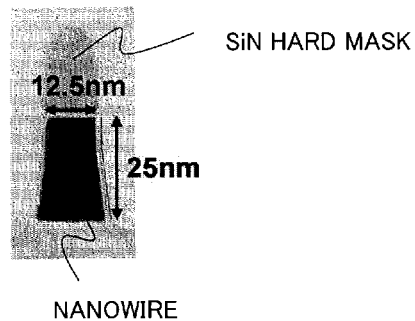
FIGS. 16A and 16B are sectional photographs for a silicon pattern having a height of 25 nm of the first embodiment.

FIGS. 16A and 16B are sectional photographs for the silicon pattern having the height of 25 nm. FIG. 16A is a sectional TEM photograph of the narrow portion before the epitaxial growth, and FIG. 16B is a sectional TEM photograph after the epitaxial growth.

FIG. 16B illustrates the sectional shapes of the case that the silicon pattern is not subjected to the ion implantation and the case that the silicon pattern is subjected to the boron ion implantation when the silicon pattern has the widths (design width) of 100 nm and 15 nm.

In FIG. 16A, the silicon pattern having the design width of 15 nm is formed into a trapezoidal shape before the epitaxial film formation. On the other hand, after the epitaxial silicon film formation, the wide portion has a hexagonal shape, and the narrow portion has a rhombic shape.

Through the epitaxial growth, silicon is grown in the width direction by about 15 nm on one side, and grown in the height direction by about 25 nm. The reason the hexagonal shape and the rhombic shape are obtained is that a (111) facet emerges on the surface during the epitaxial growth. Because of the emergence of the facet, it is understood that the silicon pattern has high crystallinity before the film growth.

The case that the ion implantation is not performed is substantially identical to the case that the boron ion implantation is performed in the shape after the epitaxial silicon film formation. This shows that the boron ion implantation does not influence the epitaxial growth too much under the above conditions for the silicon nanowire having the height of 25 nm.

Figures 17A, 17B:
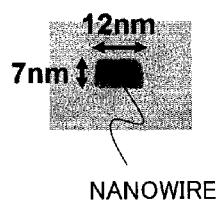
FIGS. 17A and 17B are sectional photographs for the silicon pattern having the height of 10 nm of the first embodiment.

FIGS. 17A and 17B are sectional photographs for the silicon pattern having the height of 10 nm. FIG. 17A is a sectional TEM photograph of the narrow portion before the epitaxial growth, and FIG. 17B is a sectional TEM photograph after the epitaxial growth.

In the narrow portion, the same rhombic shape is obtained for both the case that the ion implantation is not performed and the case that the boron ion implantation is performed. On the other hand, in the wide portion, while the silicon growth is wholly obtained in the case that the ion implantation is not performed, the epitaxial growth is obstructed in a central portion of the silicon pattern in the case that the boron ion implantation is performed. That is, a thin silicon region is generated because the epitaxial film is not grown in the central portion of the silicon pattern.

As described above, possibly the silicidation of the whole of the thin silicon region is performed when the process goes to the subsequent metal silicide forming process in the case that the thin silicon region is left in the central portion of the silicon pattern. Sometimes a lack of silicon is generated and a metal composition in the metal silicide is excessively increased, which possibly peels off the film during a wet process.

Unfortunately, for example, performance degradation of the semiconductor device due to a variation in resistance or a decrease in production yield due to the peel-off of the film during the manufacturing process possibly occurs by the generation of the thin silicon region.

Figure 18A:
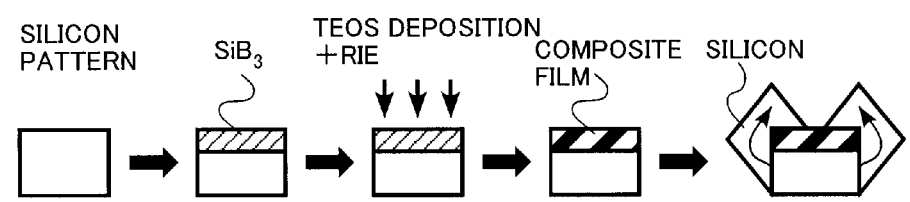
FIGS. 18A and 18B are views illustrating a problem generated in epitaxial growth after boron ion implantation.
Figure 18B:
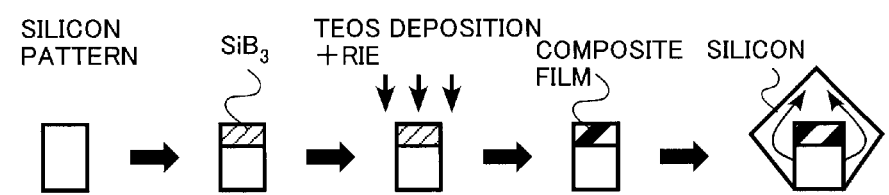

FIGS. 18A and 18B are views illustrating a problem generated in the epitaxial growth after the boron ion implantation. FIG. 18A is a schematic sectional view of the wide portion, and FIG. 18B is a schematic sectional view of the narrow portion.

The problem generated in the epitaxial growth after the boron ion implantation is attributed to the following fact. Irrespective of the width of the silicon pattern, after the boron ion implantation and the nitrogen annealing, boron is segregated in the surface of the silicon pattern to form boride ($SiB_3$). Then the deposition of the TEOS film and the removal of the TEOS film by the reactive ion etching are performed in order to form the gate sidewall. A carbon ion and the like are implanted in boride during the etching, a thin composite film having a physical property similar to that of the oxide film is formed in the surface of the silicon pattern as an epitaxial-growth obstructive film.

The composite film obstructs the epitaxial growth, and the epitaxial growth does not progress from the upper surface of the silicon pattern when the silicon pattern has the large width. As a result of the progress of the growth only from both the side surfaces, the silicon shape having the thin central portion is obtained as illustrated in FIG. 18A.

On the other hand, when the silicon pattern has the small width, the pieces of silicon grown from both the side surfaces are combined even if the epitaxial growth does not progress from the upper surface. As a result, the rhombic silicon shape is obtained as illustrated in FIG. 18. Even if the thin epitaxial-growth obstructive film is finally left in the rhombic silicon, because a current route in silicon is sufficiently ensured in both sides of the obstructive film, it is considered that a parasitic-resistance improvement effect is not significantly degraded.

The reason the epitaxial growth is significantly obstructed for the silicon pattern having the height of 10 nm compared with the silicon pattern having the height of 25 nm is that a volume of silicon is relatively decreased due to the decrease in height to significantly segregate boron in the surface of the silicon pattern. Therefore, it is considered that the problem becomes serious with finer nanowire transistor and decreasing height of the silicon nanowire. The semiconductor device manufacturing method of the first embodiment is highly effective for size scaling of the p-type nanowire transistor.

FIGS. 19A and 19B are views illustrating the action and effect of the first embodiment. FIG. 19A is a view emphasizing the wide portion, and FIG. 19B is a view emphasizing the narrow portion.

In the first embodiment, the wide portion 18 is covered with the photo resist 44 as illustrated in FIG. 9. Accordingly, boron is not implanted into the bold-line region including the wide portion 18 in FIG. 19A. On the other hand, boron is implanted into the bold-line narrow portion 16 in FIG. 19B. That is, boron is not implanted into the wide portion of the SOI layer, but boron is implanted only into the narrow portion of the SOI layer. Therefore, the epitaxial-growth obstructive film is not formed in the wide portion after the RIE and the annealing.

As illustrated in FIGS. 17A and 17B, when the silicon pattern has the small width, the epitaxial growth of the boron-doped silicon can be performed without the thin silicon region. As illustrated in FIGS. 16A and 16B, even if silicon pattern has the large width, the epitaxial growth of silicon into which the ion implantation is not performed can be performed without the thin silicon region. Therefore, in the manufacturing method of the first embodiment, the epitaxial growth can be performed to both the narrow portion and the wide portion of the SOI layer without the thin silicon region.

Accordingly, the parasitic resistance is reduced in the narrow portion in which the silicon pattern is narrow, and the on-current of the silicon nanowire transistor is improved.

As described above, the thin silicon region is not left after the epitaxial growth. Therefore, the problem that the metal silicide having the excessive metal composition is formed to generate the peel-off of the film during the wet process is not generated during the subsequent silicide process in the source-drain-region. Accordingly, the high-yield process can be performed without generating dust.

According to the first embodiment, the semiconductor device manufacturing method can effectively be provided when the epitaxial films are formed in the semiconductor narrow portions on both the sides of the gate electrode to reduce the parasitic resistance in order to improve the on-current of the p-type nanowire transistor.

In preparing the nanowire transistor or the planar type transistor of the background art, usually the extension ion implantation is performed with a photo resist mask in order to separate dopant species implanted in the n-type transistor region and the p-type transistor region. Advantageously, in the first embodiment, it is only necessary to change the photo resist mask pattern used in the extension ion implantation of the background art to the pattern that covers portions except the narrow portion of the SOI layer, and it is not necessary to add a new mask and a new process.

As to the method for preventing the adverse influence of the extension ion implantation on the epitaxial growth, it is also conceivable that the gate sidewall is formed without performing the extension ion implantation, the epitaxial growth is performed, and then the impurity ion implantation is performed to the source-drain region. However, in the method, because of a long distance between the gate electrode and the ion implantation region, unfortunately an offset region where the impurity is insufficiently implanted exists between the gate electrode and the source-drain region to increase the parasitic resistance.

On the other hand, according to the manufacturing method of the first embodiment, the extension ion implantation is performed to the region near the gate electrode before the gate sidewall formation and the epitaxial growth. Therefore, the offset region is not performed, but the effect of the decrease in parasitic resistance by the epitaxial growth can maximally be exerted.

According to the manufacturing method of the first embodiment, the ion implantation of the impurity is performed to the wide portion of the SOI layer as the source-drain region not during the extension ion implantation but after the epitaxial growth. Because the silicon layer is thickened by the epitaxial growth, the ion implantation can be performed while the acceleration voltage is higher than that of the extension ion implantation, namely, a Rp (projected range) is deepened, and the process time and the process cost are reduced.

According to the manufacturing method of the first embodiment, because the epitaxial growth is performed while the crystallinity of the silicon nanowire is completely recovered, the facet emerges on the surface of the grown epitaxial silicon layer. As illustrated in FIG. 14, the (111) plane orientation emerges on the end surface on the side of the gate sidewall 24 of the epitaxial silicon layer 30.

Therefore, the inclination of about 54 degrees relative to the substrate is generated, and a gap exists between the upper portion of the epitaxial silicon layer 30 and the gate sidewall 24. The existence of the gap reduces the parasitic capacitance between the gate electrode 22 and the epitaxial silicon layer 30 to enhance a transistor operating speed.

Assuming that L is a gate length that is of a length in the source-drain direction of the gate electrode, desirably the width and the height in a direction perpendicular to the source-drain direction of the narrow portion are 3 nm or more and 2 L/3 or less. When the width and the height are less than 3 nm, possibly carrier mobility is excessively decreased. When the width and the height are more than 2 L/3, possibly a short-channel-effect immunity is degraded.

In the first embodiment, the gate sidewall is processed by the RIE by way of example. It is considered that, in the RIE, a large amount of carbon ion is introduced to silicon to easily form the epitaxial-growth obstructive film. However, even in processes except the RIE, the manufacturing method of the first embodiment is effective in adopting a process method in which the carbon ion may be introduced to silicon.

In FIG. 9, the end portion of the photo resist that covers the wide portion overhangs the narrow portion by way of example. In consideration of misalignment, the pattern of the first embodiment is effectively used to securely cover the wide portion. However, the effect that suppresses the formation of the epitaxial-growth obstructive film in the wide portion is sufficiently obtained even if the end portion of the photo resist that covers the wide portion exists in the wide portion and the narrow portion, or even if the end portion of the photo resist that covers the wide portion overhangs the wide portion. Accordingly, it is not always necessary to limit to the pattern in FIG. 9.

The photo resist is used as the mask pattern of the wide portion by way of example. However, it is not always necessary that the mask pattern be limited to the photo resist.

Indium (In) may be used as the p-type impurity in the extension ion implantation.

Second Embodiment

A semiconductor device manufacturing method of a second embodiment differs from that of the first embodiment only in an n-type nanowire transistor manufacturing method. Accordingly, the descriptions of contents overlapped with the first embodiment are omitted.

The semiconductor device manufacturing method of the second embodiment solves the problem generated by amorphous silicon pattern during the extension ion implantation in the manufacturing the n-type nanowire transistor. Accordingly, the semiconductor device including the n-type nanowire transistor in which the on-current is improved can effectively be manufactured.

In the semiconductor device manufacturing method of the second embodiment, the extension ion implantation of not boron or boron difluoride but phosphorus (P) or arsenic (As) is performed to form the extension impurity region in the narrow portion. The source-drain ion implantation of not boron or boron difluoride but phosphorus (P) or arsenic (As) is performed to form the source-drain impurity region 32.

As with the first embodiment, the influence of the ion implantation on the epitaxial film formation was experimentally checked by forming the epitaxial film after the ion implantation of the impurity into the SOI layer. Using the SOI substrate, the ion implantation of phosphorus or arsenic is performed after silicon patterns having heights of 25 nm and 10 nm are formed on the buried oxide film. As to phosphorus ion implantation conditions, the implantation angle is 0 degree, the acceleration voltage is 3 keV, and the dose amount is $5 \times 10^{14}$ cm$^{-2}$. As to arsenic ion implantation conditions, the implantation angle is 0 degree, the acceleration voltage is 4 keV, and the dose amount is $4 \times 10^{14}$ cm$^{-2}$. The wide portion having the design width of 100 nm and the narrow portion having the design width of 15 nm are provided in the silicon pattern.

After the ion implantation, the nitrogen annealing is performed at 800° C. for 5 seconds in order to activate the ion, and the TEOS film corresponding to the gate sidewall of the actual nanowire transistor is deposited with the thickness of 50 nm. Then the TEOS film is removed by the RIE. The epitaxial silicon film is formed after the dilute hydrofluoric acid treatment is performed.

FIGS. 20A and 20B are sectional photographs for the silicon pattern having the height of 10 nm. FIG. 20A is a sectional TEM photograph after the epitaxial growth, and FIG. 20B is a view illustrating a crystalline state after the ion implantation.

FIG. 20A illustrates the sectional shapes of the case that the silicon pattern is subjected to the phosphorus ion implantation and the case that the silicon pattern is subjected to the arsenic ion implantation when the silicon pattern has the widths (design width) of 100 nm and 15 nm.

As is clear from FIG. 20A, the sectional shape is a circular shape or an elliptical shape in both the cases of the phosphorus ion implantation and the arsenic ion implantation, and the epitaxial growth progresses isotropically. This is attributed to the fact that the silicon-pattern nanowire is amorphous before the epitaxial film formation.

As illustrated in FIG. 20B, the whole silicon pattern becomes amorphous when a heavy dopant, such as phosphorus and arsenic, is implanted into the thin silicon layer. Because the crystalline region does not exist in the silicon pattern, the recrystallization of the silicon pattern is not generated even if the annealing is performed, but the isotropic growth is generated in the subsequent epitaxial growth. Even if the sectional area of the silicon nanowire is increased by the epitaxial growth, the problem that parasitic resistance reducing effect is decreased is generated because the silicon nanowire is amorphous or polycrystalline.

Figures 21A, 21B:
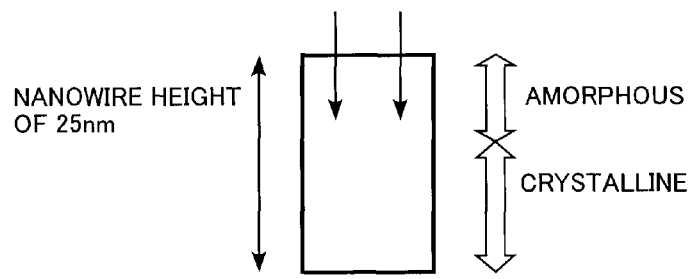
FIGS. 21A and 21B are sectional photographs for the silicon pattern having the height of 25 nm of the second embodiment.

FIGS. 21A and 21B are sectional photographs for the silicon pattern having the height of 25 nm. FIG. 21A is a sectional TEM photograph after the epitaxial growth, and FIG. 21B is a view illustrating the crystalline state after the ion implantation.

FIG. 21A illustrates the sectional shapes of the case that the silicon pattern is subjected to the phosphorus ion implantation and the case that the silicon pattern is subjected to the arsenic ion implantation when the silicon pattern has the widths (design width) of 100 nm and 15 nm.

As is clear from FIG. 21A, in the sectional shape, the (111) crystalline plane emerges unlike the silicon pattern having the width of 10 nm. As illustrated in FIG. 21B, for the thick silicon pattern, the crystalline region is left in the lower portion of the silicon pattern after the ion implantation. Therefore, during the annealing, the recrystallization of the whole silicon pattern is generated with the crystalline region as the seed. Thus, when phosphorus or arsenic is implanted, it is necessary to ensure the crystalline region that constitutes the seed of the recrystallization.

Figure 22A:
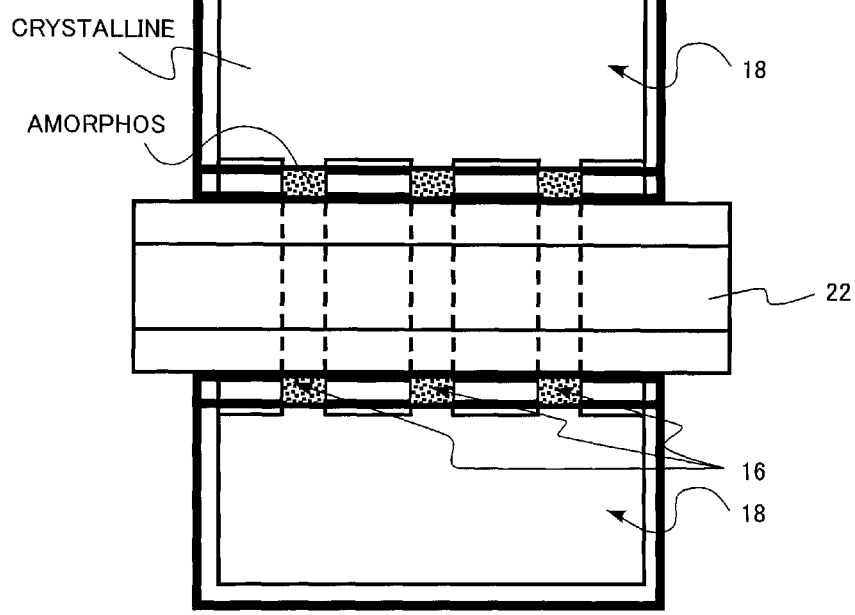
FIGS. 22A and 22B are views illustrating action and effect of the second embodiment.
Figure 22B:
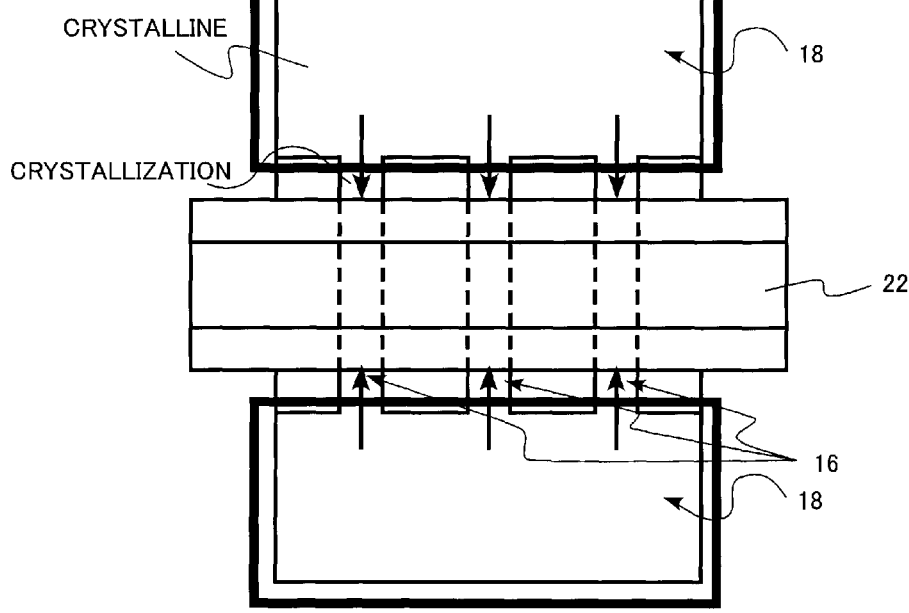

FIGS. 22A and 22B are views illustrating the action and effect of the second embodiment. FIG. 22A is a view illustrating the crystalline state immediately after the ion implantation, and FIG. 22B is a view illustrating the crystalline state after the annealing.

In the second embodiment, the wide portion 18 is covered with the photo resist 44 as illustrated in FIG. 9. Accordingly, phosphorus or arsenic is not implanted into the bold-line region including the wide portion 18 in FIG. 22A. On the other hand, phosphorus or arsenic is implanted in the bold-line narrow portion 16.

That is, phosphorus or arsenic is implanted only in the narrow portion of the SOI layer to form amorphous silicon. On the other hand, because phosphorus or arsenic is not implanted in the wide portion of the SOI layer, the silicon remains in the crystalline state.

As illustrated in FIG. 22B, during the annealing after the ion implantation, the recrystallization of the narrow portion is generated with the crystalline region of the wide portion as the seed. Therefore, the single-crystal silicon can be grown in the narrow portion during the epitaxial growth, and the semiconductor device including the n-type nanowire transistor in which the on-current is improved can effectively be manufactured.

As described above, the silicon pattern having the height of 10 nm is harder to fabricate than the silicon pattern having the height of 25 nm in that the crystalline region that constitutes the seed for the recrystallization is secured. Therefore, it is considered that the problem becomes serious with finer nanowire transistor and decreasing height of the silicon nanowire. The semiconductor device manufacturing method of the second embodiment is highly effective for size scaling of the n-type nanowire transistor.

According to the manufacturing method of the second embodiment, because the epitaxial growth is performed while the crystallinity of the silicon nanowire is completely recovered, the facet emerges on the surface of the grown epitaxial silicon layer. As illustrated in FIG. 14, the (111) plane orientation emerges on the end surface on the side of the gate sidewall 24 of the epitaxial silicon layer 30.

Therefore, the inclination of about 54 degrees relative to the substrate is generated, and the gap exists between the upper portion of the epitaxial silicon layer 30 and the gate sidewall 24. The existence of the gap reduces the parasitic capacitance between the gate electrode 22 and the epitaxial silicon layer 30 to enhance the transistor operating speed.

As to the method for avoiding the influence of the amorphous silicon pattern by the extension ion implantation of phosphorus or arsenic, it is conceivable that the acceleration voltage is decreased lower than, for example, 1 keV during the ion implantation such that the Rp becomes the silicon layer thickness or less, whereby the crystalline region is left in the lower portion of the silicon nanowire. However, the method is not realistic as the mass production process because huge amounts of time and cost are required for the ion implantation performed with the ultra-low acceleration voltage. On the other hand, according to the manufacturing method of the second embodiment, the acceleration voltage of the extension ion implantation to the silicon pattern can be set to a realistic value in the order of keV, and the manufacturing method of the second embodiment has an advantage from the viewpoint of cost.

Third Embodiment

A semiconductor device manufacturing method of a third embodiment differs from the first and second embodiments in that not the SOI substrate but a bulk substrate without the buried oxide film is used as the semiconductor substrate. The descriptions of contents overlapped with the first or second embodiment are omitted.

Figure 23:
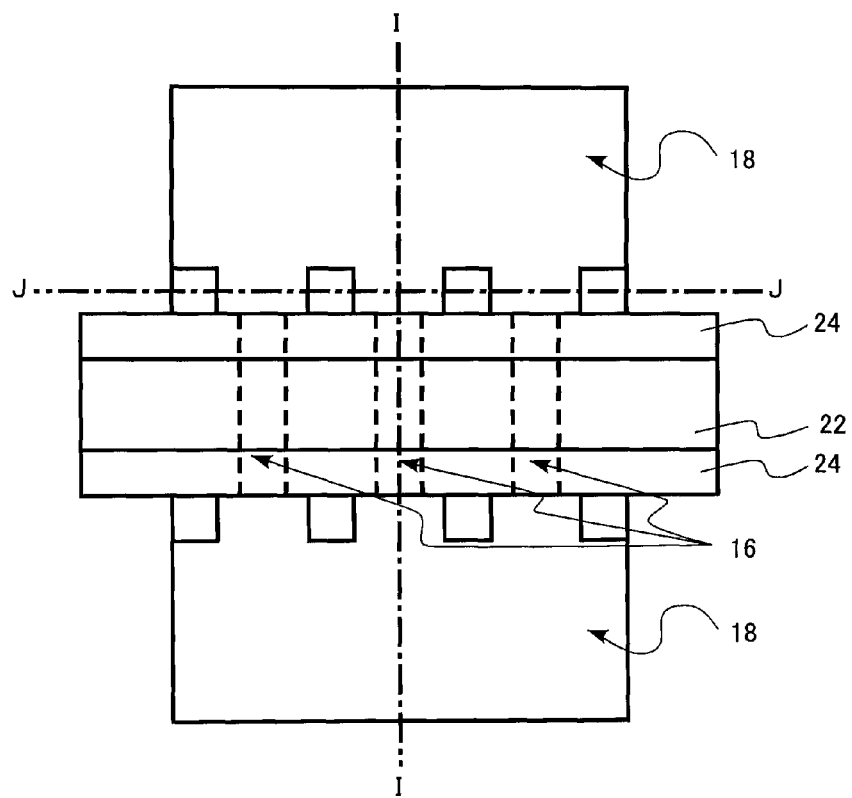
FIG. 23 is a schematic plan view of a nanowire transistor manufactured by a manufacturing method of a third embodiment.
Figure 24:
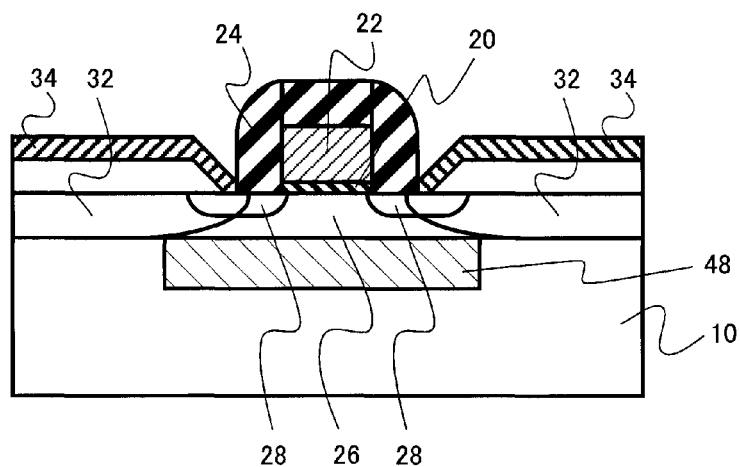
FIG. 24 is a schematic sectional view taken on a line I-I (gate-length direction) of FIG. 23.
Figure 25:
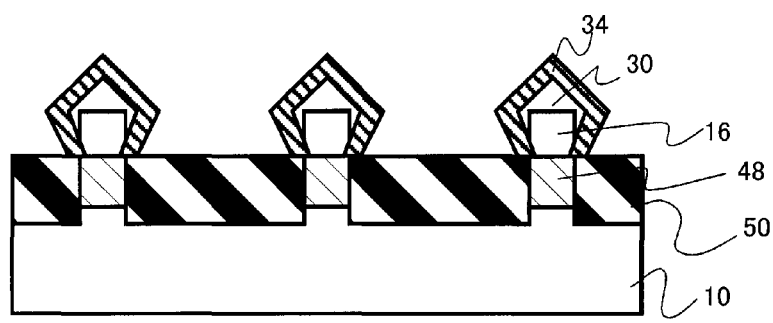
FIG. 25 is a schematic sectional view taken on a line J-J (gate-width direction) of FIG. 23.

FIG. 23 is a schematic plan view of a nanowire transistor manufactured by a manufacturing method of the third embodiment. FIG. 24 is a schematic sectional view taken on a line I-I (gate-length direction) of FIG. 23, and FIG. 25 is a schematic sectional view taken on a line J-J (gate-width direction) of FIG. 23.

For example, the nanowire transistor is formed on the (100)-plane silicon substrate 10. The silicon substrate 10 includes the narrow portion (silicon nanowire) 16 and the wide portion 18 in the upper portion thereof. An impurity region 48 for punchthrough stopper is provided in the silicon substrate 10 below the silicon nanowire 16. An STI layer 50 is formed on the lower side-surface of the silicon nanowire 16.

The gate insulating film 20 is formed on the side surface and the upper surface of the silicon nanowire 16, and the gate electrode 22 is formed on the gate insulating film 20. The gate sidewalls 24 are formed on both sides of the gate electrode 22.

The p-type extension impurity regions 28 are formed in the gate sidewalls 24 and the silicon nanowire 16 such that the channel region 26 below the gate electrode 22 is sandwiched between the extension impurity regions 28. The epitaxial silicon layer 30 is formed on the extension impurity region 28.

The p-type source-drain impurity regions 32 are formed in the silicon nanowire 16 and the epitaxial silicon layer 30. The metal silicide layers 34 are formed on the source-drain impurity regions 32. Thus, the source-drain regions, each of which includes the source-drain impurity region 32 and the metal silicide layer 34, are formed on both the sides of the gate electrode 22.

In the silicon nanowire 16 above the impurity region 48 for punchthrough stopper, the region above which the gate electrode 22 is formed operates as the channel region 26. The channel region 26 is formed into the plate-like structure having widths (length in the gate-width direction) of about 3 nm to about 20 nm and heights of about 3 nm to about 40 nm. The side surface of the silicon nanowire 16 is the (110) plane.

The manufacturing method of the third embodiment will be described below with reference to FIGS. 26 to 29.

First the bulk silicon substrate 10 is prepared as the semiconductor substrate. For example, the hard mask layer 40 made of the silicon nitride film is formed on the silicon substrate 10.

Figure 26:
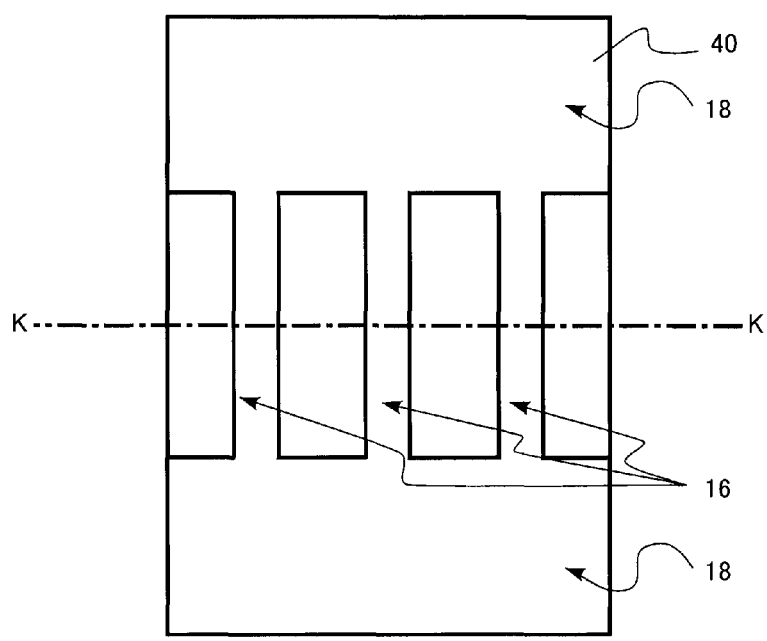
FIG. 26 is a schematic plan view illustrating a manufacturing process of the third embodiment.
Figure 27:
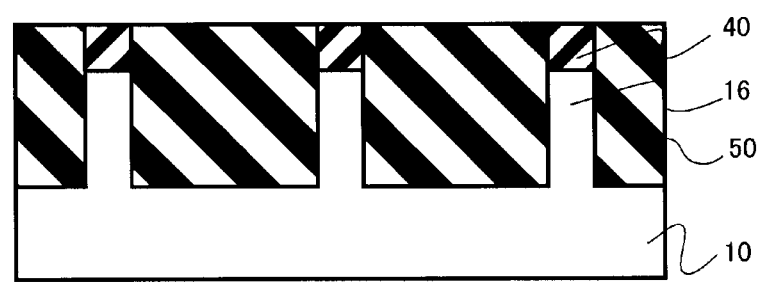
FIG. 27 is a schematic sectional view taken on a line K-K of FIG. 26.

FIG. 26 is a schematic plan view illustrating a manufacturing process of the third embodiment, and FIG. 27 is a schematic sectional view taken on a line K-K of FIG. 26. First, the hard mask layer 40 is patterned after formed on the silicon substrate 10.

The upper portion of the silicon substrate 10 is etched with the hard mask layer 40 as the mask, and the upper portion of the silicon substrate 10 is partially narrowed in the gate-width direction, thereby forming the plate shape. The plate-like silicon layer (silicon nanowire) 16 has widths of about 3 nm to about 20 nm. Thus, the semiconductor region including the narrow portion 16 and the wide portion 18 is formed in the upper portion of the semiconductor substrate.

In patterning the hard mask layer 40, both the gate-length direction and the narrow-portion direction are set to a direction equivalent to the <110> direction, whereby the side surface of the silicon nanowire 16 constitutes the (110) plane after the etching.

Then the STI layer 50 made of, for example, the silicon oxide film is buried between the silicon nanowires 16. Then the surface of the STI layer 50 is planarized by CMP (see FIGS. 26 and 27).

Figure 28:
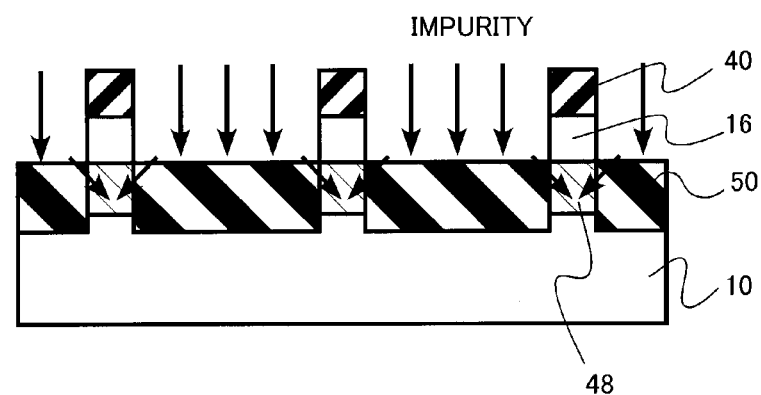
FIG. 28 is a schematic sectional view illustrating the manufacturing process of the third embodiment.

FIG. 28 is a schematic plan view illustrating the manufacturing process of the third embodiment. After the surface of the STI layer 50 is planarized, as illustrated in FIG. 28, the dilute hydrofluoric acid treatment is performed to etch halfway the STI layer 50. Then, by performing the impurity ion implantation, the impurity region 48 for punchthrough stopper is formed below the silicon nanowire 16 while sandwiched between STI layers 50.

At this point, the impurity species is the p-type impurity for the n-type transistor, and the impurity species is the n-type impurity for the p-type transistor. In order to interrupt current passage (punchthrough) from the source to the drain through the silicon substrate 10, and in order to avoid an excessive increase in substrate capacitance, desirably the impurity region 50 for punchthrough stopper has impurity densities of $1 \times 10^{18}$ cm$^{-3}$ or more and $1 \times 10^{20}$ cm$^{-3}$ or less.

Because the following manufacturing processes are identical to those of the first or second embodiment, the descriptions are omitted.

According to the manufacturing method of the third embodiment, as with the first or second embodiment, the epitaxial growth is performed after the extension ion implantation is performed only to the narrow portion of the silicon nanowire. Accordingly, the good growth is implemented in the epitaxial film.

Therefore, the good epitaxial silicon layer is formed to increase the sectional area of silicon on the gate electrode that constitutes a main cause of the parasitic resistance and part of the silicon nanowire, in which the gate sidewall is not formed, namely, the silicon nanowire that constitutes part of the source-drain region. Therefore, the parasitic resistance is largely reduced to significantly increase the on-current of the nanowire transistor. The problem that the yield is decreased by the dust is not generated.

According to the manufacturing method of the third embodiment, the substrate cost and the production cost can largely be reduced by the use of the bulk substrate instead of the SOI substrate.

Fourth Embodiment

In a semiconductor device manufacturing method of a fourth embodiment, the gate insulating film is formed only on the side surface in the narrow portion of the SOI layer, and the FinFET is manufactured while the hard mask layer is left to the end of the manufacturing process above the narrow portion of the SOI layer. The fourth embodiment differs from the first or second embodiment only in not the nanowire transistor but the FinFET. Accordingly, the descriptions of contents overlapped with the first or second embodiment are omitted.

Figures 29, 30:
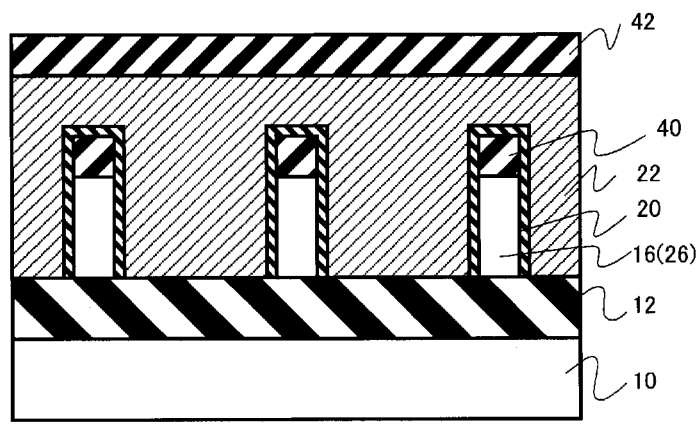
FIG. 29 is a schematic sectional view in a gate-width direction of a FinFET manufactured by a manufacturing method of a fourth embodiment.
FIG. 30 is a sectional photograph when an epitaxial film is grown on a silicon nanowire having a different plane orientation.

FIG. 29 is a schematic sectional view in a gate-width direction of a FinFET manufactured by a manufacturing method of the fourth embodiment. The FinFET of the fourth embodiment differs from the transistor manufactured by the manufacturing method of the first or second embodiment in that the gate insulating film 20 is formed only on the side surface in the narrow portion 16 of the SOI layer 14 and that the hard mask layer 40 exists on the narrow portion 16 of the SOI layer 14.

In the manufacturing method of the fourth embodiment, the SOI layer 14 is etched with the hard mask layer 40 as the mask, the SOI layer 14 is partially narrowed in the gate-width direction to form the plate shape, and then the gate insulating film 20 is formed on the side surface in the narrow portion 16 of the SOI layer 14 without removing the hard mask layer 40. The manufacturing method of the fourth embodiment differs from the manufacturing method of the first or second embodiment in the above point and in that, when the gate electrode 22 and the gate insulating film 20 are patterned, the hard mask layer 40 is also etched to expose the narrow portion 16 of the SOI layer 14 except the gate electrode 22.

According to the manufacturing method of the fourth embodiment, as with the first or second embodiment, the epitaxial growth is performed after the extension ion implantation is performed only to the narrow portion of the SOI layer. Accordingly, the good growth is implemented in the epitaxial film.

Therefore, the good epitaxial silicon layer is formed to increase the sectional area of silicon on the gate electrode that constitutes a main cause of the parasitic resistance and the narrow portion of the SOI layer, in which the gate sidewall is not formed, namely, the narrow portion of the SOI layer that constitutes part of the source-drain region. Therefore, the parasitic resistance is largely reduced to significantly increase the on-current of the FinFET. The problem that the yield is decreased by the dust is not generated.

According to the manufacturing method of the fourth embodiment, the upper surface in the narrow portion of the SOI layer does not operate as the channel region. Therefore, advantageously reliability degradation caused by an electric field concentration on a corner portion of the channel region, namely, an upper left end and an upper right end, which possibly becomes problematic in the nanowire transistor in which the upper surface operates as the channel region.

Fifth Embodiment

In a semiconductor device manufacturing method of a fifth embodiment, the side surface of the silicon nanowire 16 is set to the (100) plane in the manufacturing method of the first or second embodiment.

A nanowire transistor prepared by the manufacturing method of the fifth embodiment differs from the nanowire transistor prepared by the manufacturing method of the first or second embodiment in that the silicon nanowire 16 has the (100)-plane side surface.

The manufacturing method of the fifth embodiment differs from the manufacturing method of the first or second embodiment in that both the gate-length direction and the narrow-portion direction are set to the direction equivalent to the <100> direction when the hard mask layer 40 is patterned in order to etch the SOI layer 14 in FIGS. 5 and 6.

Accordingly, the descriptions of contents overlapped with the first or second embodiment are omitted.

According to the manufacturing method of the fifth embodiment, as with the first or second embodiment, the epitaxial growth is performed after the extension ion implantation is performed only to the narrow portion of the silicon nanowire. Accordingly, the good growth is implemented in the epitaxial film.

Therefore, the good epitaxial silicon layer is formed to increase the sectional area of silicon on the gate electrode that constitutes a main cause of the parasitic resistance and part of the silicon nanowire, in which the gate sidewall is not formed, namely, the silicon nanowire that constitutes part of the source-drain region. Therefore, the parasitic resistance is largely reduced to significantly increase the on-current of the nanowire transistor.

FIG. 30 is a sectional SEM photograph when an epitaxial film is grown on a silicon nanowire having a different plane orientation. FIG. 30 illustrates the sectional SEM photograph when the activation annealing, the gate sidewall processing, and the epitaxial film formation are performed after the boron ion implantation is performed to the silicon nanowire having the (110)-plane and (100)-plane side surfaces and the height of 15 nm.

The silicon shape becomes the rhombic shape after the epitaxial growth for the (110)-plane side surface, and the silicon shape becomes the rectangular shape after the epitaxial growth for the (100)-plane side surface. Therefore, the plane orientation equivalent to the (100) plane emerges on the silicon surface.

For the (110) plane, the silicon thickness is increased through the epitaxial growth by 15 nm on one side in a crosswise direction and by 35 nm in an upward direction. On the other hand, for the (100) plane, the silicon thickness is increased through the epitaxial growth by 30 nm on one side in the crosswise direction and by 40 nm in the upward direction. Thus, the increase of the silicon sectional area through the epitaxial growth is larger in the case that the side surface has the (100) plane than in the case that the side surface has the (110) plane, and advantageously the parasitic resistance can largely be reduced in the case that the side surface has the (100) plane.

Sixth Embodiment

In a semiconductor device manufacturing method of a sixth embodiment, a first semiconductor region that includes the narrow portion and the wide portion, a second semiconductor region wider than the narrow portion of the first semiconductor region, and a third semiconductor region wider than the narrow portion of the first semiconductor region are formed in the upper portion of the semiconductor substrate while the second semiconductor region and the third semiconductor region are located in positions different from that of the first semiconductor region in the plane. A resistive element is formed in the second semiconductor region, and a transistor in which the gate is wider than the nanowire transistor formed in the first semiconductor region is formed in the third semiconductor region.

The semiconductor device manufacturing method of the sixth embodiment differs from that of the first embodiment in that the second semiconductor region and the third semiconductor region are formed and that the second semiconductor region and the third semiconductor region are covered with the mask informing the extension impurity region. Accordingly, the descriptions of contents overlapped with the first embodiment are omitted.

Figure 31:
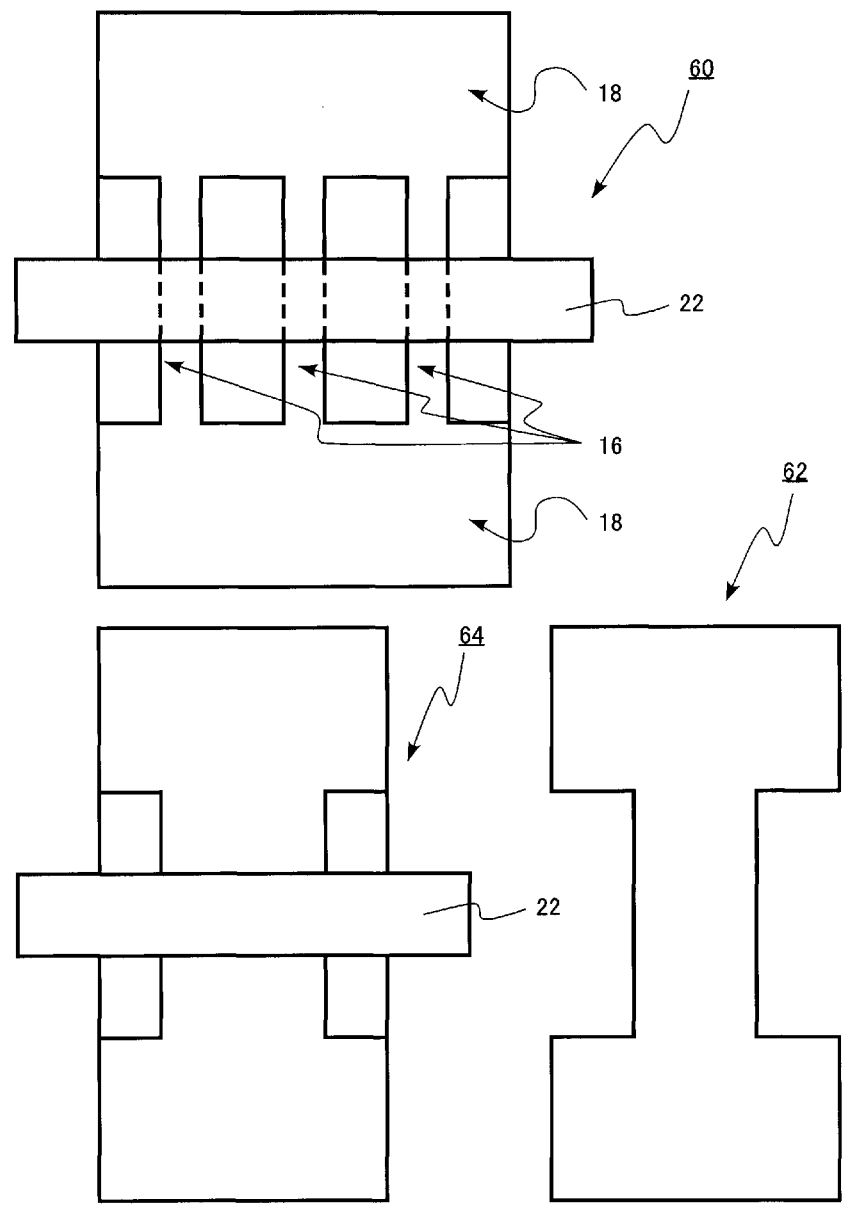
FIG. 31 is a schematic plan view illustrating a manufacturing process of a fifth embodiment.

FIG. 31 is a schematic plan view illustrating the manufacturing process of the sixth embodiment. As illustrated in FIG. 31, a first semiconductor region 60 that includes the narrow portion 16 and the wide portion 18, a second semiconductor region 62 wider than the narrow portion 16 of the first semiconductor region 60, and a third semiconductor region 64 wider than the narrow portion 16 of the first semiconductor region 60 are formed in the upper portion of the semiconductor substrate.

FIG. 31 is a schematic plan view of the manufacturing process at the end of the patterning of the gate electrode 22 and the gate insulating film 20. FIG. 31 corresponds to FIG. 5 of the first embodiment. The gate electrodes 22 are formed on the first semiconductor region 60 in which the nanowire transistor is formed and the third semiconductor region 64, in which the gate is wider than the nanowire transistor, for example, the transistor having gate widths of about 100 nm to about 1 μm is formed. The gate electrode 22 is not formed in the second semiconductor region 64 in which the resistive element is formed.

FIG. 32 is a schematic plan view illustrating the manufacturing process of the sixth embodiment. After the gate electrode 22 and gate insulating film 20 are patterned, the mask pattern that covers the wide portion 18 of the first semiconductor region 60 and the whole surfaces of the second semiconductor region 62 and the third semiconductor region 64 is formed using the photo resist 44.

Then the extension ion implantation of boron (B) or boron difluoride ($BF_2$) is performed with the photo resist 44 as the mask. Then the annealing is performed for the purpose of the activation and the recrystallization.

In an LSI circuit, sometimes it is necessary to form the resistive element and the transistor including the wide gate in addition to the nanowire transistor. For example, the resistive element implements the desired resistance value by properly setting the length or width of the impurity region formed in the silicon substrate or the metal silicide layer formed on the silicon substrate, and the resistive element is used as a resistor in the circuit. Therefore, for example, when a trouble is generated during the epitaxial growth on the silicon substrate, possibly the resistance value is changed to become the unstable circuit operation. In forming the transistor including the wide gate, when a trouble is generated during the epitaxial growth on the silicon substrate, the parasitic resistance is increased in the source-drain region to degrade a characteristic.

In the wide semiconductor region except the nanowire transistor, the performance degradation of the LSI and the decrease in production yield due to the dust are generated when the epitaxial growth on the silicon substrate is obstructed.

According to the sixth embodiment, the ion implantation is performed while the silicon pattern wider than the narrow portion 16 in which the nanowire transistor is formed is masked, which suppresses the formation of the film that obstructs the epitaxial growth on the silicon pattern wider than the narrow portion 16. Accordingly, the good growth of the epitaxial film can be performed in both the narrow portion 16 and other silicon patterns. Therefore, according to the sixth embodiment, the high-performance semiconductor device including the nanowire transistor in which an on-current is improved can be manufactured with the high production yield.

While certain embodiments have been described, these embodiments have been presented by way of example only, and are not intended to limit the scope of the inventions. Indeed, the semiconductor device manufacturing method described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

In the embodiments, by way of example, silicon is used as the material for the semiconductor film for the epitaxial growth. In addition to silicon, for example, silicon germanium or silicon carbon can be used as the material for the semiconductor film formed in the source-drain region. A compressive strain in the gate-length direction is induced in the channel region when the silicon-germanium layer is formed in the source-drain region in the p-type transistor, and a tensile strain in the gate-length direction is induced in the channel region when the silicon-carbon layer is formed in the source-drain region in the n-type transistor. In both cases, advantageously the drain current is increased to enhance the transistor operating speed.

In the embodiments, by way of example, the transistor includes the source-drain impurity region in the source-drain region. However, it is not always necessary to include the source-drain impurity region in the source-drain region. For example, a Schottky transistor including only the metal silicide layer may be used.

What is claimed is:

1. A semiconductor device manufacturing method comprising:
    forming a first semiconductor region including a narrow portion and a wide portion in an upper portion of a semiconductor substrate;
    forming a gate insulating film on at least side surfaces of the narrow portion;
    forming a gate electrode on the gate insulating film;
    forming a mask pattern that covers the wide portion;
    performing ion implantation of an impurity with the mask pattern as a mask to form an extension impurity region in the narrow portion;
    removing the mask pattern;
    performing a heat treatment after performing the ion implantation to activate the impurity;
    forming a gate sidewall on a side surface of the gate electrode;
    performing epitaxial growth of a semiconductor film on the narrow portion and the wide portion after removing the mask pattern and after forming the gate sidewall; and
    forming source-drain regions on both sides of the gate electrode after performing the epitaxial growth of the semiconductor film.

2. The method according to claim 1, wherein the impurity is boron or boron difluoride.

3. The method according to claim 1, wherein the impurity is phosphorus or arsenic.

4. The method according to claim 1, wherein reactive ion etching is adopted in forming the gate sidewall.

5. The method according to claim 1, further comprising:
    forming a second semiconductor region having a dimension that is wider than a dimension of the narrow portion in any orientation parallel to a surface of the semiconductor substrate, the second semiconductor region formed at a position different from that of the first semiconductor region in the upper portion of the semiconductor substrate,
    wherein the second semiconductor region is covered by the mask pattern when forming the mask pattern covers the wide portion.

6. The method according to claim 5, wherein a resistive element is formed in the second semiconductor region.

7. The method according to claim 1, wherein a width and a height of the narrow portion are 3 nm or more and 2 L/3 or less, where L is a gate length of the gate electrode.

8. The method according to claim 1, wherein the semiconductor film is silicon, silicon germanium, or silicon carbon.

9. The method according to claim 1, wherein the semiconductor substrate is an SOI substrate.

10. The method according to claim 1, wherein the extension impurity region has an impurity concentration of $1\times10^{19}$ cm$^{-3}$ or more.

11. The method according to claim 1, wherein a temperature of the heat treatment is 800° C. or higher and 1100° C. or lower.

12. The method according to claim 1, wherein a thickness in a gate-length direction of the gate sidewall is 5 nm or more and 30 nm or less.

13. The method according to claim 1, wherein a thickness of the semiconductor film is 10 nm or more and 50 nm or less.

14. The method according to claim 1, wherein the source-drain region has an impurity concentration of $1\times10^{20}$ cm$^{-3}$ or more.

15. The method according to claim 1, wherein the gate electrode has a gate length of 30 nm or less.

16. The method according to claim 1, wherein a side surface of the narrow portion is a (110) plane.

17. The method according to claim 1, further comprising forming a metal silicide layer on the source-drain region.

* * * * *